(12) United States Patent
Chen et al.

(10) Patent No.: US 10,424,543 B2
(45) Date of Patent: *Sep. 24, 2019

(54) OVERLAY MARK

(71) Applicant: TAIWAN SEMICONDUCTOR MANUFACTURING COMPANY, LTD., Hsinchu (TW)

(72) Inventors: Chen-Yu Chen, Taipei (TW); Ming-Feng Shieh, Yongkang (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/207,056

(22) Filed: Nov. 30, 2018

(65) Prior Publication Data
US 2019/0115303 A1    Apr. 18, 2019

Related U.S. Application Data

(63) Continuation of application No. 16/048,018, filed on Jul. 27, 2018, which is a continuation of application
(Continued)

(51) Int. Cl.
*H01L 23/544*    (2006.01)
*G03F 7/20*      (2006.01)
*H01L 21/302*    (2006.01)
*H01L 29/06*     (2006.01)
*H01L 29/78*     (2006.01)

(52) U.S. Cl.
CPC ........ *H01L 23/544* (2013.01); *G03F 7/70633* (2013.01); *G03F 7/70683* (2013.01);
(Continued)

(58) Field of Classification Search
CPC ..................................................... H01L 23/544
(Continued)

(56) References Cited

U.S. PATENT DOCUMENTS

| 5,545,593 A | 8/1996 | Watkins et al. |
| 6,218,200 B1 | 4/2001 | Chen et al. |

(Continued)

FOREIGN PATENT DOCUMENTS

TW          530361       5/2003

*Primary Examiner* — Kara E. Geisel
*Assistant Examiner* — Omar H Nixon
(74) *Attorney, Agent, or Firm* — Hauptman Ham, LLP

(57) ABSTRACT

A method of forming an overlay mark includes disposing a first feature of a plurality of first alignment segments extending along a first direction in a first layer, disposing a second feature of a plurality of second alignment segments extending along a second direction in a second layer over the first layer, and forming a third feature of a plurality of third alignment segments extending along the first direction and a plurality of fourth alignment segments extending along the second direction in a third layer over the second layer. In a plan view, each first alignment segment of the first alignment segments is adjacent to a corresponding third alignment segment of the third alignment segments along the first direction, and each second alignment segment of the second alignment segments is adjacent to a corresponding fourth alignment segment of the fourth alignment segments along the second direction.

20 Claims, 21 Drawing Sheets

Related U.S. Application Data

No. 14/551,653, filed on Nov. 24, 2014, now Pat. No. 10,043,759, which is a continuation of application No. 13/536,855, filed on Jun. 28, 2012, now Pat. No. 8,908,181.

(52) U.S. Cl.
CPC ........ *H01L 21/302* (2013.01); *H01L 29/0649* (2013.01); *H01L 29/78* (2013.01); *H01L 2924/0002* (2013.01)

(58) Field of Classification Search
USPC .......................................................... 356/400
See application file for complete search history.

(56) References Cited

U.S. PATENT DOCUMENTS

| | | |
|---|---|---|
| 6,751,485 B2 | 6/2004 | Ranta |
| 6,759,112 B2 | 7/2004 | Wong |
| 6,784,004 B2 | 8/2004 | Wong |
| 6,951,784 B1 | 10/2005 | Anderson et al. |
| 7,180,593 B2 | 2/2007 | Lin |
| 7,190,823 B2 | 3/2007 | Chen |
| 7,408,642 B1 | 8/2008 | DiBiase |
| 7,927,960 B2 | 4/2011 | Yang et al. |
| 8,143,731 B2 | 3/2012 | Chiu |
| 2003/0212525 A1 | 11/2003 | Bischoff et al. |
| 2005/0193362 A1 | 9/2005 | Phan et al. |
| 2008/0034344 A1 | 2/2008 | Chiu et al. |
| 2009/0068843 A1 | 3/2009 | Yang |
| 2009/0087756 A1 | 4/2009 | Schulz et al. |
| 2011/0133347 A1* | 6/2011 | Huang ................ G03F 7/70283 257/797 |
| 2011/0266032 A1 | 11/2011 | Xie et al. |
| 2012/0237857 A1 | 9/2012 | Chiu |
| 2013/0107259 A1 | 5/2013 | Choi et al. |
| 2013/0147066 A1 | 6/2013 | Cheng et al. |
| 2014/0254916 A1 | 9/2014 | Lee et al. |
| 2015/0130031 A1 | 5/2015 | Yoshino |

\* cited by examiner

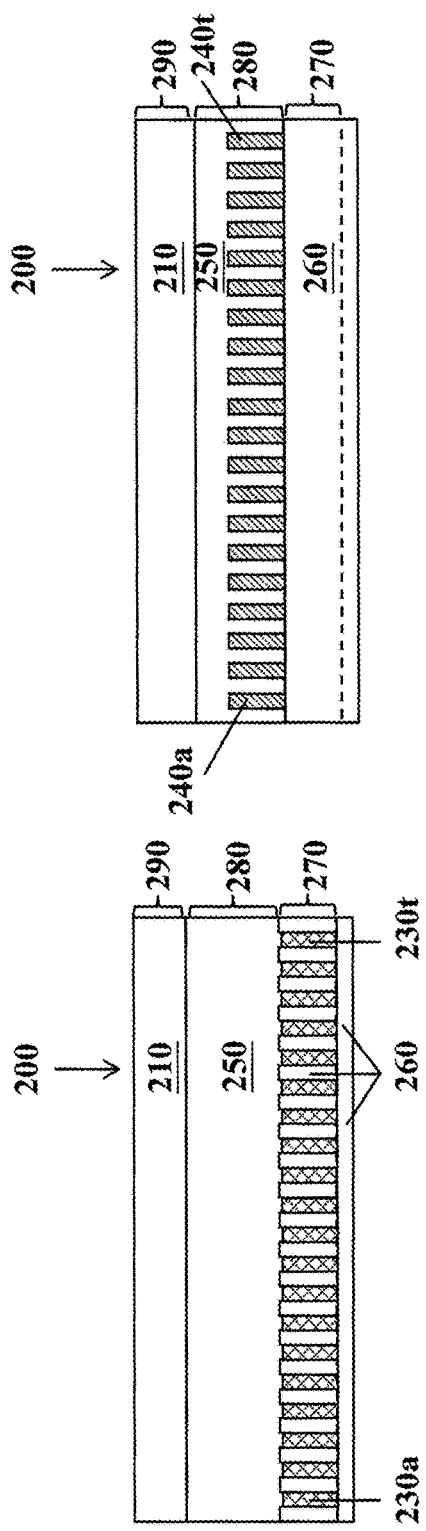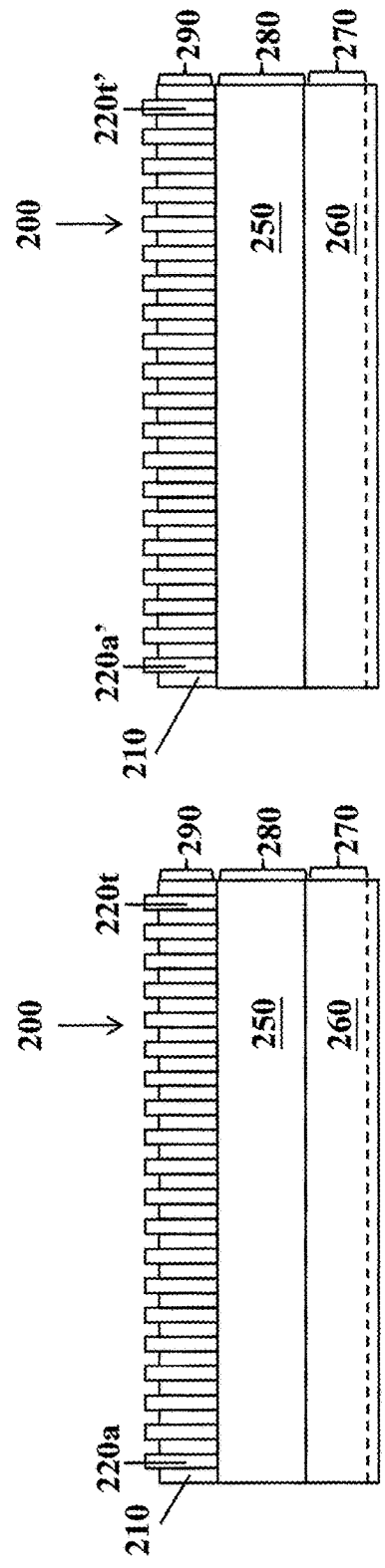
FIG. 6A
FIG. 6B
FIG. 6C
FIG. 6D

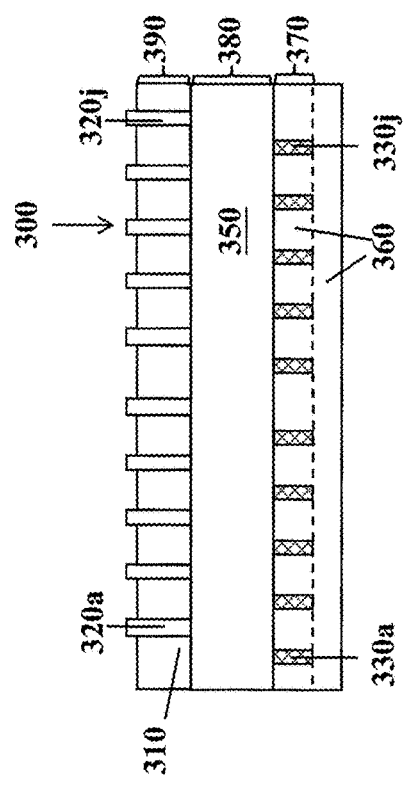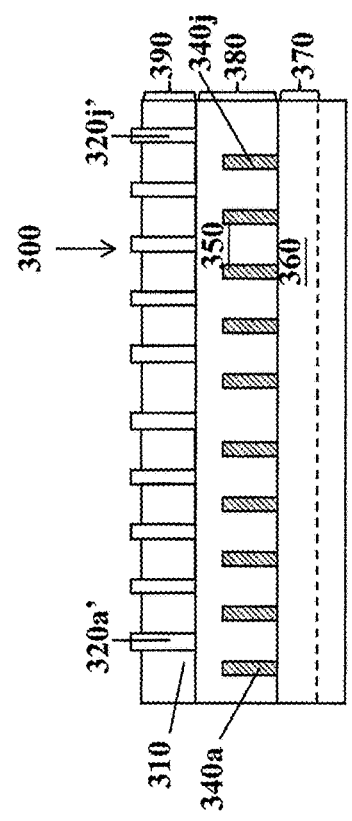
FIG. 8A
FIG. 8B

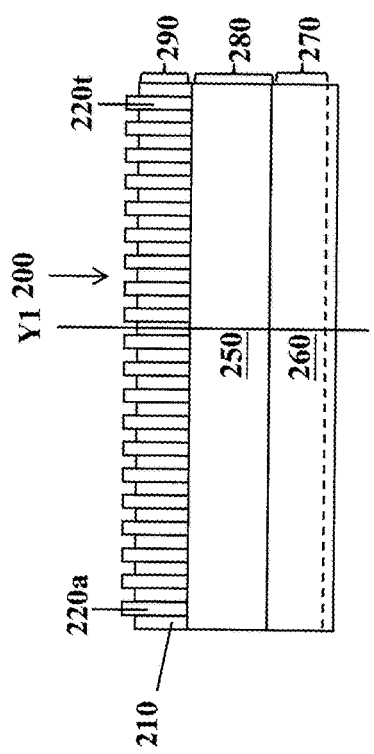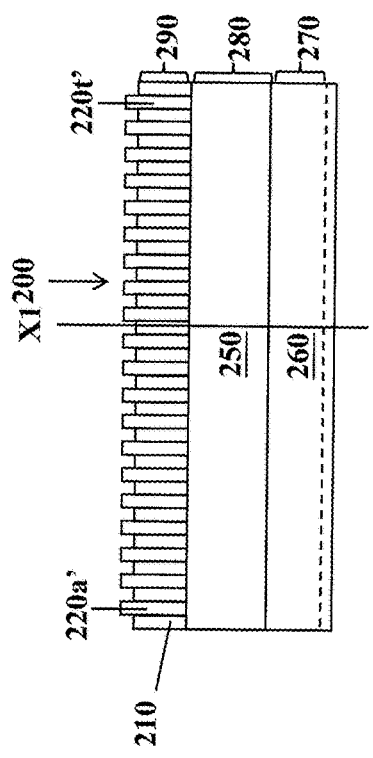

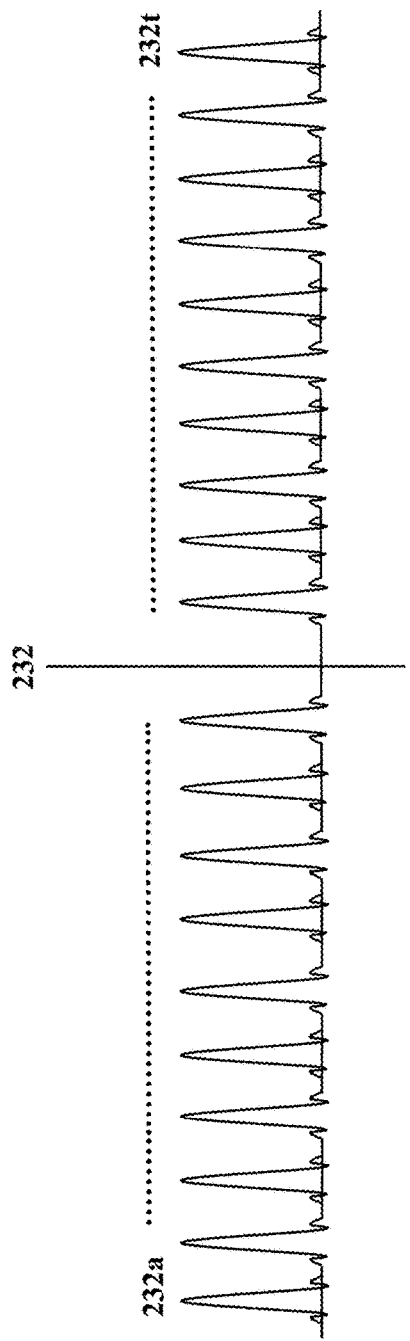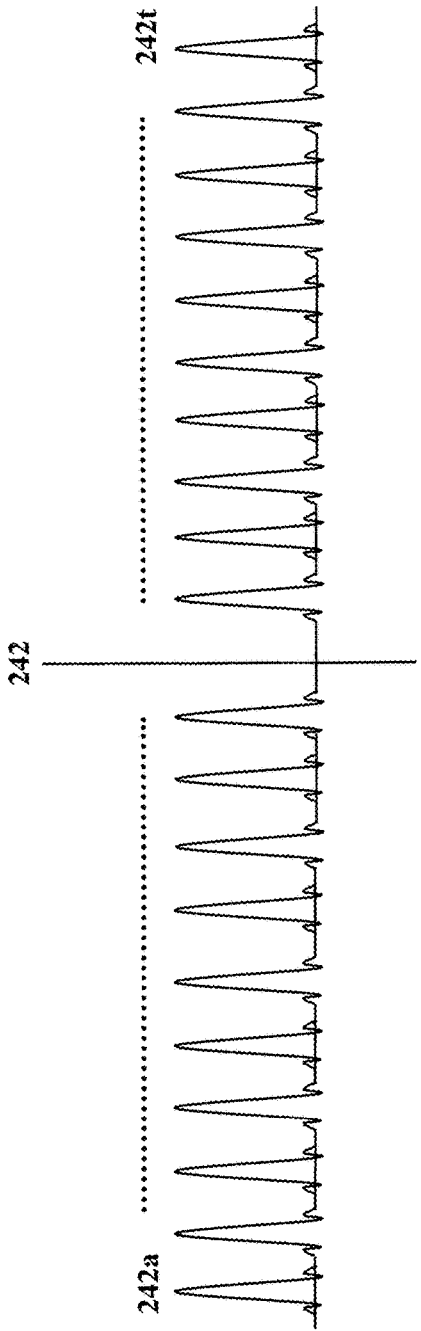

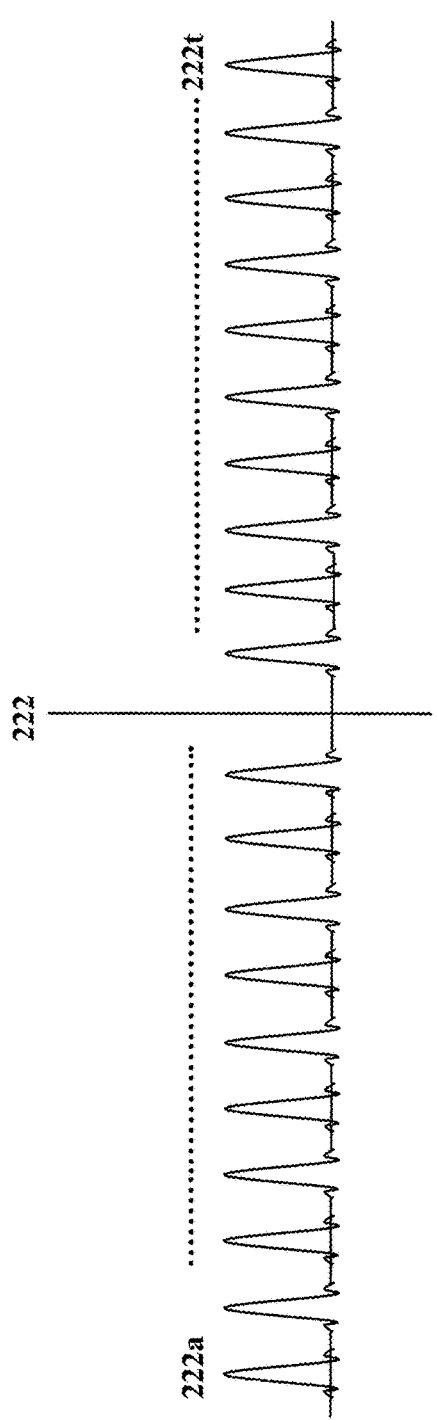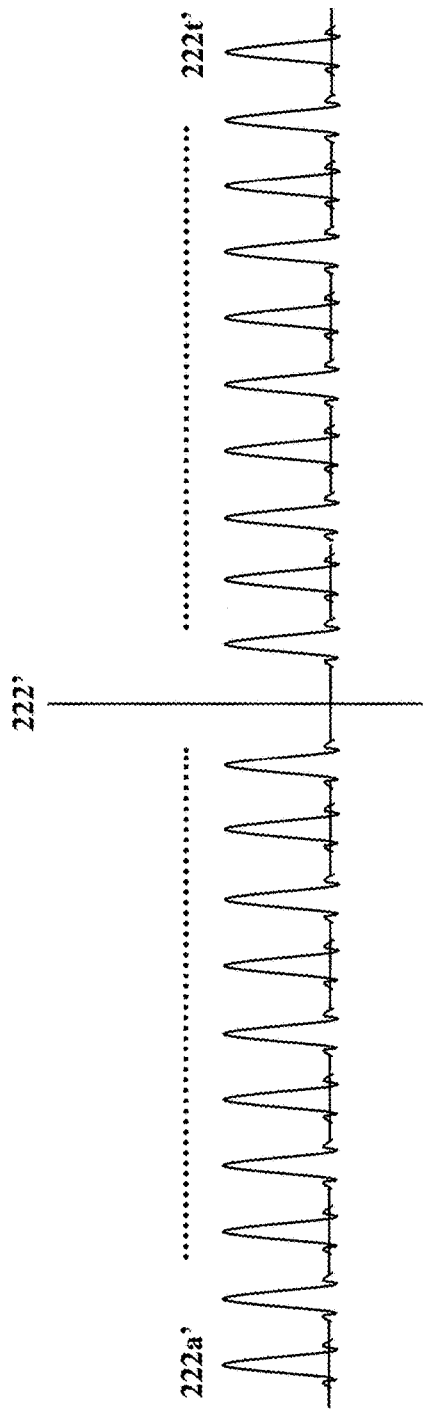

OVERLAY MARK

PRIORITY CLAIM

The present application is a continuation of U.S. application Ser. No. 16/048,018, filed Jul. 27, 2018, which is a continuation of U.S. application Ser. No. 14/551,653, filed Nov. 14, 2014, now U.S. Pat. No. 10,043,759, issued Aug. 7, 2018, which is a continuation of U.S. application Ser. No. 13/536,855, filed Jun. 28, 2012, now U.S. Pat. No. 8,908,181, issued Dec. 9, 2014, the disclosures of which are incorporated herein by reference in their entireties.

BACKGROUND

The semiconductor integrated circuit (IC) industry has experienced rapid growth. Technological advances in IC materials and design have produced generations of ICs where each generation has smaller and more complex circuits than the previous generation. Nowadays, the semiconductor devices and integrated circuits include multi-layer structures having dimensions smaller than one micrometer. As known in the art, a photolithography process is a step that determines the critical dimension (CD) in the manufacture of a semiconductor integrated circuit device. Electric circuit patterns are formed by first transferring the pattern on a photo mask to a photoresist layer in a photolithography process, and then transferring the pattern from the photoresist layer to an underlying material layer such as a dielectric layer or a metal layer in a subsequent etching process.

In addition to the control of CD, a successful photolithography process on a wafer includes alignment accuracy (AA). As the scaling down continues especially below 20 nm, aligning multiple layers accurately has become more and more difficult. Therefore, the measurement of accuracy, i.e., the measurement of overlay error, is crucial to the semiconductor fabrication process. An overlay mark is used as a tool for measuring overlay error and to determine whether the photoresist pattern is precisely aligned with the previous layer on a wafer after a photolithography process.

If all or part of the mask is not aligned properly, the resulting features may not align correctly with adjoining layers. This may result in reduced device performance or complete device failure. While existing overlay marks have been used to prevent this, they have not been entirely satisfactory for small dimensional devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6A is a cross-sectional view taken along a cutting line C-C' of FIG. 5.

FIG. 6B is a cross-sectional view taken along a cutting line D-D' of FIG. 5.

FIG. 6C is a cross-sectional view taken along a cutting line E-E' of FIG. 5.

FIG. 6D is a cross-sectional view taken along a cutting line F-F' of FIG. 5.

FIG. 8A is a cross-sectional view taken along a cutting line G-G' of FIG. 7.

FIG. 8B is a cross-sectional view taken along a cutting line H-H' of FIG. 7.

FIG. 15C is a cross-sectional view taken along a cutting line E-E' of FIG. 5, including a centerline Y1.

FIG. 15D is a cross-sectional view taken along a cutting line F-F' of FIG. 5, including a centerline X1.

FIG. 16A is a signal waveform measured from the overlay mark in FIG. 15A.

FIG. 16B is a signal waveform measured from the overlay mark in FIG. 15B.

FIG. 16C is a signal waveform measured from the overlay mark in FIG. 15C.

FIG. 16D is a signal waveform measured from the overlay mark in FIG. 15D.

DETAILED DESCRIPTION

Figure 2:
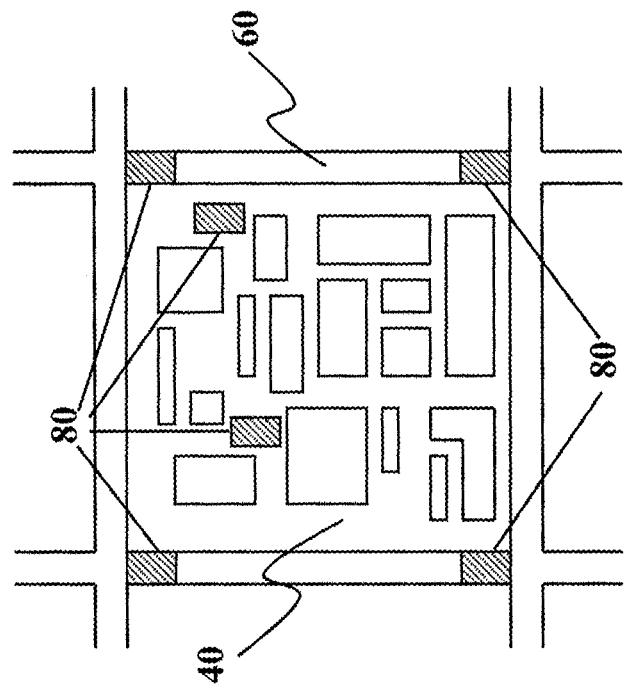
FIG. 2 is a top view of the enlargement of a dotted region in FIG. 1.

The present disclosure relates in general to an overlay mark for checking alignment accuracy, and more particularly, to an overlay mark for aligning different layers on a substrate and to a method for adjusting multi-layer overlay alignment.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
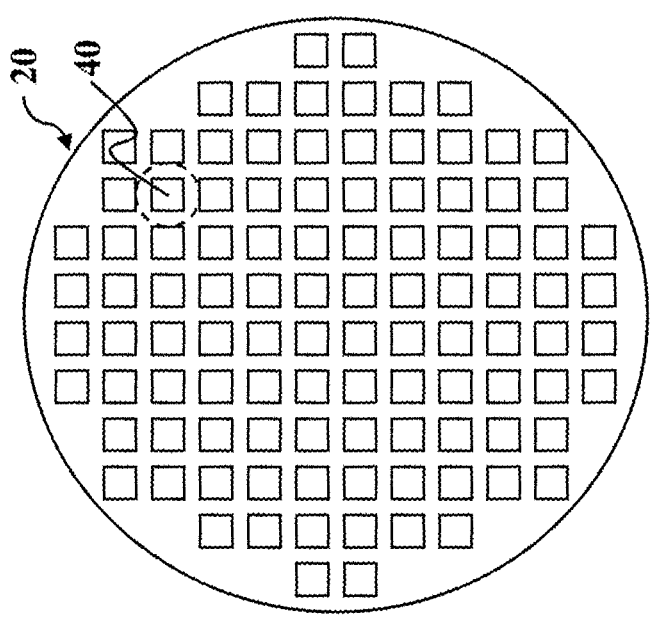
FIG. 1 is a top view of a wafer that illustrates positions of overlay marks according to various aspects of the present disclosure.

FIG. 1 is a top view of a wafer 20 that illustrates positions of overlay marks according to various aspects of the present disclosure. FIG. 2 is a top view of the enlargement of a dotted region in FIG. 1. As shown in FIGS. 1 and 2, the wafer 20 is sawed along scribe lines 60 into a plurality of chips or dies 40. Normally, the overlay marks 80 are located on the scribe lines 60 at four corners of an edge of each chip 40 or located inside each chip 40 to measure whether the present layer, such as an opening of a photoresist layer, is precisely aligned with a pre-layer in the fabrication process.

While measuring an overlay error using an overlay mark according to prior approaches, an X-directional deviation is measured along a straight line in an X direction of the overlay mark. A Y-directional deviation is further measured along a straight line in a Y direction of the overlay mark. One single overlay mark can only be used to measure one X- and one Y-directional deviation between two layers on a substrate. When all the overlay marks are measured using this method, whether the present layer and the pre-layer are precisely aligned can be calculated according to the X- and Y-directional deviations.

To check alignment accuracy between three layers, the prior approach used two separate overlay marks on the substrate. According to the prior approach, one overlay mark is used for checking alignment accuracy between the first pre-layer and the present layer, and the other overlay mark is used for checking alignment accuracy between the second pre-layer and the present layer. The area cost is very high for two overlay marks positioned on different areas of the substrate. As the design rule shrinks and the fabrication of the integrated circuits tends to use multi-layer design, the area cost issue of the overlay marks becomes seriously high. Additionally, for checking the alignment accuracy between the first pre-layer and the present layer, the Y-directional deviation may be more concerned than the X-directional deviation. For checking the alignment accuracy between the second pre-layer and the present layer, the X-directional deviation may be more concerned than the Y-directional deviation. However, the method for measuring the overlay error according to the prior approach would collect all the X-directional deviations and Y-directional deviations between the first pre-layer and the present layer, and those between the second pre-layer and the present layer. It would be time-consuming to collect and analyze some data which are not so concerned.

Figure 3:
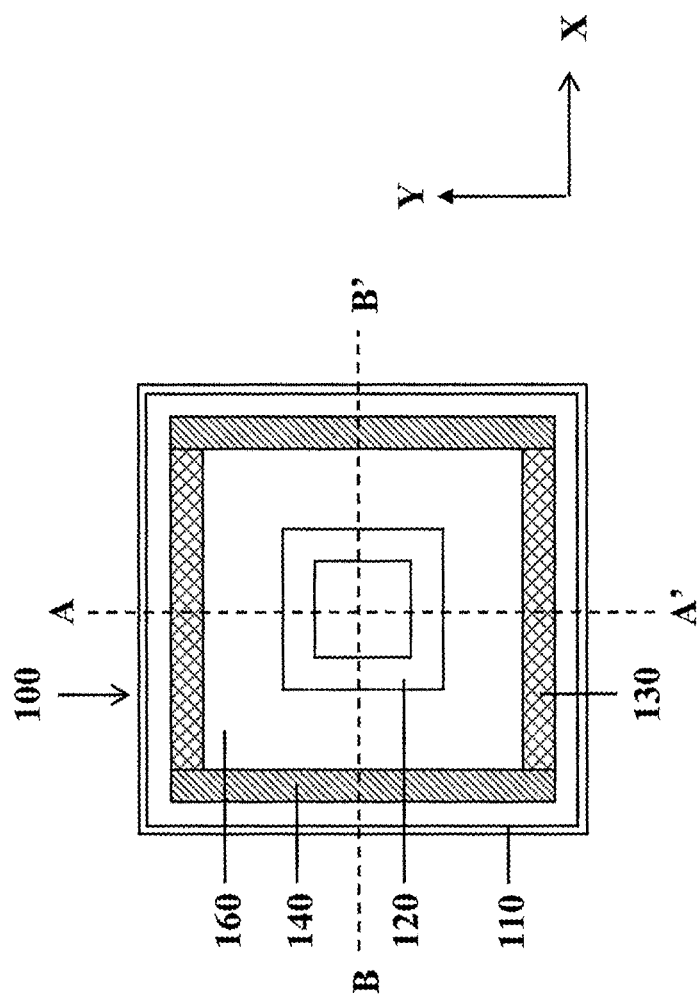
FIG. 3 is a top view of an overlay mark for aligning different layers over a substrate according to various aspects of the present disclosure.

FIG. 3 is a top view of an overlay mark 100 for aligning different layers over a substrate 160 according to various aspects of the present disclosure. As shown in FIG. 3, a device (not shown) comprises the overlay mark 100 over the substrate 160. The device may include various devices or elements, such as semiconductor devices, bipolar junction transistors, resistors, capacitors, diodes, fuses, etc., but is simplified for a better understanding of the concepts of the present disclosure. The substrate 160 may typically be a silicon substrate. The substrate 160 may include various doping configurations depending on design requirements as known in the art. The substrate 160 may also include other elementary semiconductors such as germanium and diamond. Alternatively, the substrate 160 may include a compound semiconductor and/or an alloy semiconductor. Further, the substrate 160 may optionally include an epitaxial layer (epi layer), may be strained for performance enhancement, may include a silicon-on-insulator (SOI) structure, and/or have other suitable enhancement elements. The overlay mark 100 comprises various features over the substrate 160, such as a first feature 130, a second feature 140, and a third feature 120. The first feature 130 represents the pattern of a first pre-layer (hereinafter, a first layer 170), the second feature 140 represents the pattern of a second pre-layer (hereinafter, a second layer 180), and the third feature 120 represents the pattern of the present layer (hereinafter, a third layer 190), such as an opening of a mask 110.

Figure 4B:
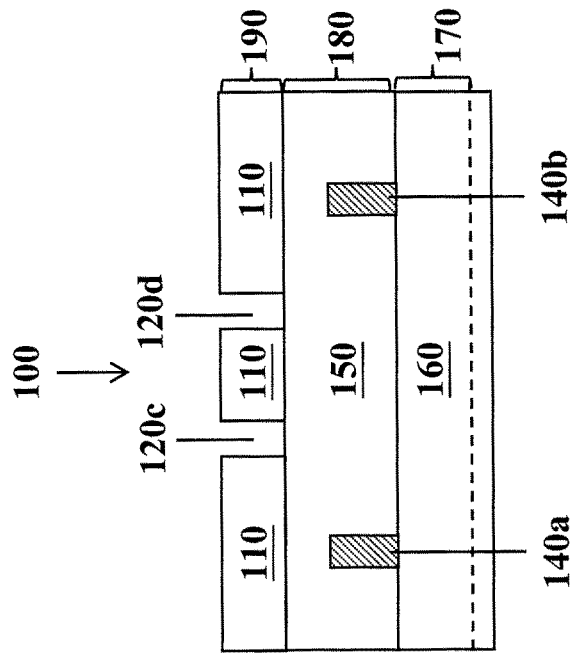
FIG. 4B is a cross-sectional view taken along a cutting line B-B' of FIG. 3.
Figure 4A:
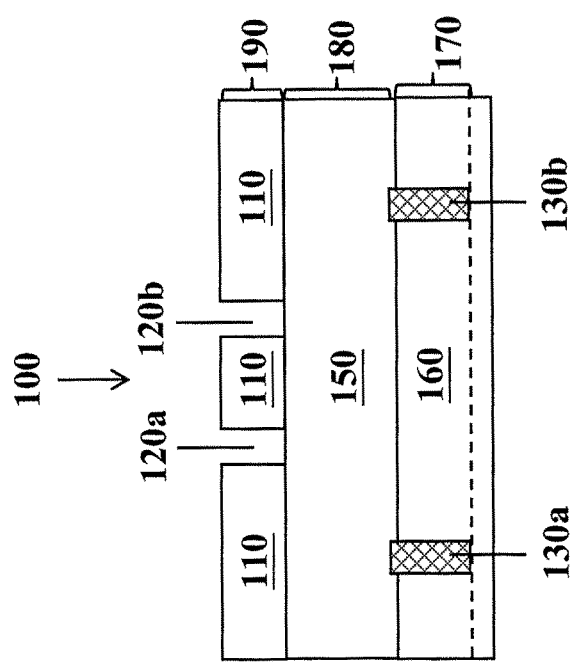
FIG. 4A is a cross-sectional view taken along a cutting line A-A' of FIG. 3.

FIG. 4A is a cross-sectional view taken along a cutting line A-A' of FIG. 3. As shown in FIGS. 3 and 4A, the first feature 130 is disposed in a first layer 170 over the substrate 160, and the first feature 130 extends only along a first longitudinal direction. The first feature 130 comprises a plurality of alignment segments 130a, 130b substantially parallel to each other. The first feature 130 may comprise an isolation structure such as a shallow trench isolation (STI), a field oxide (FOX), a local-oxidation of silicon (LOCOS) feature, and/or other suitable isolation element. The isolation structure may comprise a dielectric material such as silicon oxide, silicon nitride, silicon oxy-nitride, fluoride-doped silicate (FSG), a low-k dielectric material, combinations thereof, and/or other suitable material. In some embodiments, the first longitudinal direction is an X direction.

FIG. 4B is a cross-sectional view taken along a cutting line B-B' of FIG. 3. As shown in FIGS. 3 and 4B, the second feature 140 is disposed in a second layer 180 over the first layer 170, and the second feature 140 extends along a second longitudinal direction different from the first longitudinal direction. The second feature 140 comprises a plurality of alignment segments 140a, 140b substantially parallel to each other. The second feature 140 may comprise a gate electrode. The gate electrode may be sacrificial, for example, such as formed in a replacement gate process. In some embodiments, the gate electrode includes polysilicon. The polysilicon may be formed by suitable deposition processes such as, for example, low-pressure chemical vapor deposition (LPCVD) and plasma-enhanced CVD (PECVD). In some embodiments, the gate electrode includes conductive material such as metal. In some embodiments, the second longitudinal direction is a Y direction substantially perpendicular to the X direction.

As depicted in FIGS. 3, 4A, and 4B, the third feature 120 is disposed in a third layer 190 over the second layer 180, and the third feature 120 extends along both the first longitudinal direction and the second longitudinal direction. The third feature 120 comprises a plurality of alignment segments 120a, 120b substantially parallel to each other extending along the first longitudinal direction and a plurality of alignment segments 120c, 120d substantially parallel to each other extending along the second longitudinal direction. The third feature 120 may comprise a continuous opening or a plurality of openings 120a-120d in a mask 110. The mask 110 may comprise a positive-tone or negative-tone photoresist such as polymer, or a hard mask such as silicon nitride or silicon oxy-nitride. The third layer 190 may be patterned using suitable photolithography processes such as, for example, forming a photoresist layer, exposing the photoresist layer to a pattern, baking and developing the photoresist to form the mask 110. The mask 110 may then be used to etch a pattern (e.g., a contact) into a dielectric layer 150 such as silicon oxide disposed below the mask 110. In some embodiments, the third feature 120 comprises four alignment segments 120a-120d forming a rectangular pattern or a square pattern. In some embodiments, the first longitudinal direction is substantially perpendicular to the second longitudinal direction. In some embodiments, the first longitudinal direction is the X direction and the second longitudinal direction is the Y direction substantially perpendicular to the X direction.

Figure 5:
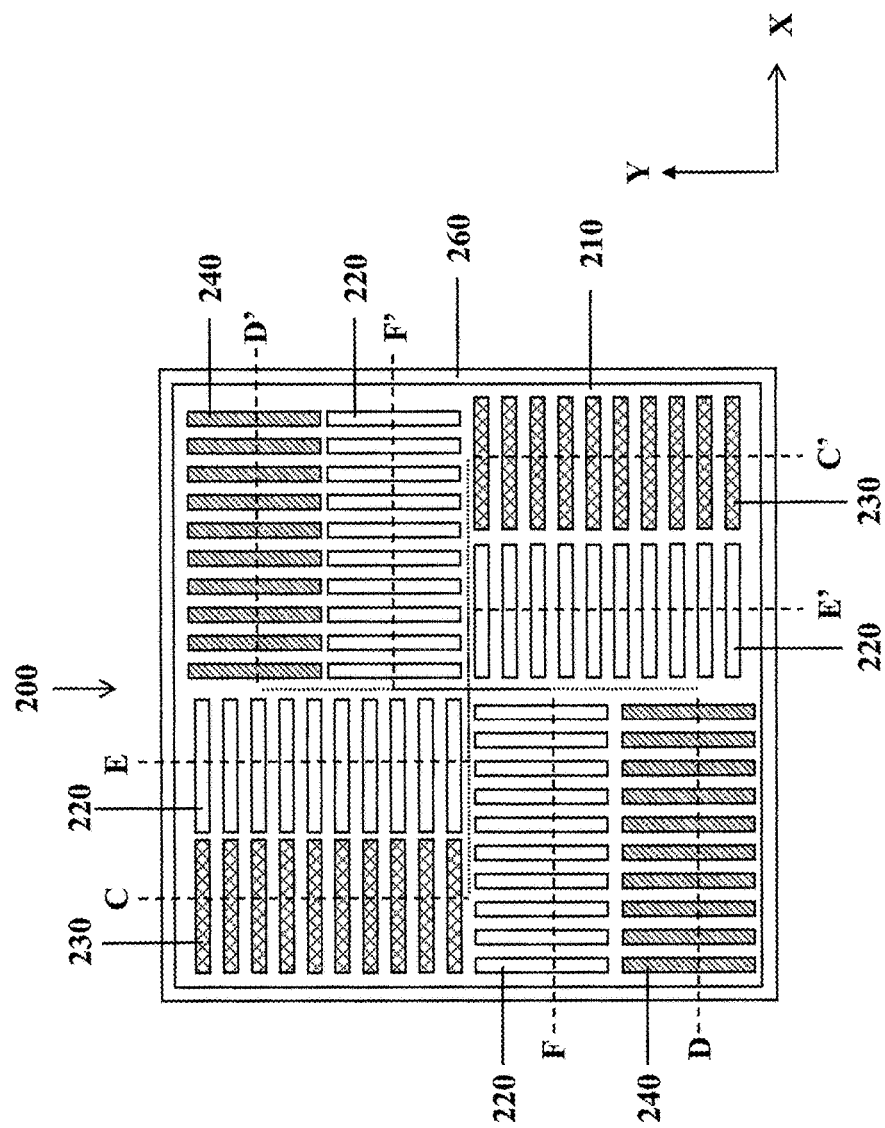
FIG. 5 is a top view of an overlay mark for aligning different layers over a substrate according to various aspects of the present disclosure.

FIG. 5 is a top view of an overlay mark 200 for aligning different layers over a substrate 260 according to various aspects of the present disclosure. As shown in FIG. 5, a device (not shown) comprises the overlay mark 200 over the substrate 260. The device may include various devices or elements, such as semiconductor devices, bipolar junction transistors, resistors, capacitors, diodes, fuses, etc., but is simplified for a better understanding of the concepts of the present disclosure. The substrate 260 may typically be a silicon substrate. The substrate 260 may include various doping configurations depending on design requirements as known in the art. The substrate 260 may also include other elementary semiconductors such as germanium and diamond. Alternatively, the substrate 260 may include a compound semiconductor and/or an alloy semiconductor. Further, the substrate 260 may optionally include an epitaxial layer (epi layer), may be strained for performance enhancement, may include a silicon-on-insulator (SOI) structure, and/or have other suitable enhancement elements. The overlay mark 200 comprises various features over the substrate 260, such as a first feature 230, a second feature 240, and a third feature 220. The first feature 230 represents the pattern of a first pre-layer (hereinafter, a first layer 270), the second feature 240 represents the pattern of a second pre-layer (hereinafter, a second layer 280), and the third feature 220 represents the pattern of the present layer (hereinafter, a third layer 290), such as an opening of a mask 210.

FIG. 6A is a cross-sectional view taken along a cutting line C-C' of FIG. 5. Please note that the cross-sectional view in FIG. 6A shows only the dashed portions of the cutting line C-C' in FIG. 5 while the dotted portion is not shown. In other words, the cross-sectional views of the dashed portions of the cutting line C-C' are linked together in FIG. 6A. As shown in FIGS. 5 and 6A, the first feature 230 is disposed in a first layer 270 over the substrate 260, and the first feature 230 extends only along a first longitudinal direction. The first feature 230 comprises a plurality of alignment segments 230a-230t substantially parallel to each other. The first feature 230 may comprise an isolation structure such as a shallow trench isolation (STI), a field oxide (FOX), a local-oxidation of silicon (LOCOS) feature, and/or other suitable isolation element. The isolation structure may comprise a dielectric material such as silicon oxide, silicon nitride, silicon oxy-nitride, fluoride-doped silicate (FSG), a low-k dielectric material, combinations thereof, and/or other suitable material. In some embodiments, the first longitudinal direction is an X direction.

FIG. 6B is a cross-sectional view taken along a cutting line D-D' of FIG. 5. Similarly, the cross-sectional view in FIG. 6B shows only the dashed portions of the cutting line D-D' in FIG. 5 while the dotted portion is not shown. As shown in FIGS. 5 and 6B, the second feature 240 is disposed in a second layer 280 over the first layer 270, and the second feature 240 extends along a second longitudinal direction different from the first longitudinal direction. The second feature 240 comprises a plurality of alignment segments 240a-240t substantially parallel to each other. The second feature 240 may comprise a gate electrode. The gate electrode may be sacrificial, for example, such as formed in a replacement gate process. In some embodiments, the gate electrode includes polysilicon. The polysilicon may be formed by suitable deposition processes such as, for example, low-pressure chemical vapor deposition (LPCVD) and plasma-enhanced CVD (PECVD). In some embodiments, the gate electrode includes conductive material such as metal. In some embodiments, the second longitudinal direction is a Y direction substantially perpendicular to the X direction.

FIG. 6C is a cross-sectional view taken along a cutting line E-E' of FIG. 5. The cross-sectional view in FIG. 6C shows only the dashed portions of the cutting line E-E' in FIG. 5 while the dotted portion is not shown. FIG. 6D is a cross-sectional view taken along a cutting line F-F' of FIG. 5. The cross-sectional view in FIG. 6D shows only the dashed portions of the cutting line F-F' in FIG. 5 while the dotted portion is not shown. As shown in FIGS. 5, 6C, and 6D, the third feature 220 is disposed in a third layer 290 over the second layer 280, and the third feature 220 extends along both the first longitudinal direction and the second longitudinal direction. The third feature 220 comprises a plurality of alignment segments 220a-220t substantially parallel to each other extending along the first longitudinal direction and a plurality of alignment segments 220a'-220t' substantially parallel to each other extending along the second longitudinal direction. The third feature 220 may comprise a plurality of openings 220a-220t and 220a'-220t' in a mask 210. The mask 210 may comprise a positive-tone or negative-tone photoresist such as polymer, or a hard mask such as silicon nitride or silicon oxy-nitride. The third layer 290 may be patterned using suitable photolithography processes such as, for example, forming a photoresist layer, exposing the photoresist layer to a pattern, baking and developing the photoresist to form the mask 210. The mask 210 may then be used to etch a pattern (e.g., a contact) into a dielectric layer 250 such as silicon oxide disposed below the mask 210. In some embodiments, the first longitudinal direction is substantially perpendicular to the second longitudinal direction. In some embodiments, the first longitudinal direction is the X direction and the second longitudinal direction is the Y direction substantially perpendicular to the X direction.

Figure 7:
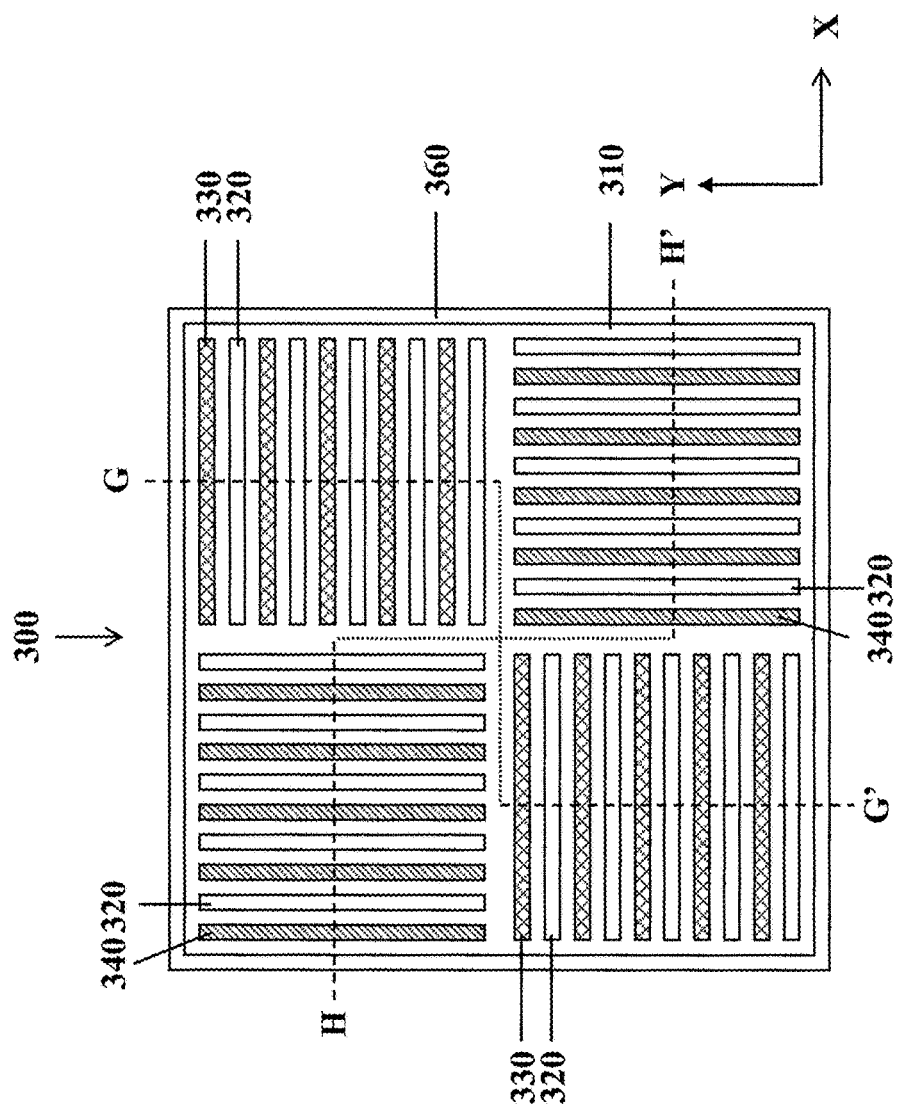
FIG. 7 is a top view of an overlay mark for aligning different layers over a substrate according to various aspects of the present disclosure.

FIG. 7 is a top view of an overlay mark 300 for aligning different layers over a substrate 360 according to various aspects of the present disclosure. As shown in FIG. 7, a device (not shown) comprises the overlay mark 300 over the substrate 360. The device may include various devices or elements, such as semiconductor devices, bipolar junction transistors, resistors, capacitors, diodes, fuses, etc., but is simplified for a better understanding of the concepts of the present disclosure. The substrate 360 may typically be a silicon substrate. The substrate 360 may include various doping configurations depending on design requirements as known in the art. The substrate 360 may also include other elementary semiconductors such as germanium and diamond. Alternatively, the substrate 360 may include a compound semiconductor and/or an alloy semiconductor. Further, the substrate 360 may optionally include an epitaxial layer (epi layer), may be strained for performance enhancement, may include a silicon-on-insulator (SOI) structure, and/or have other suitable enhancement elements. The overlay mark 300 comprises various features over the substrate 360, such as a first feature 330, a second feature 340, and a third feature 320. The first feature 330 represents the pattern of a first pre-layer (hereinafter, a first layer 370), the second feature 340 represents the pattern of a second pre-layer (hereinafter, a second layer 380), and the third feature 320 represents the pattern of the present layer (hereinafter, a third layer 390), such as an opening of a mask 310.

FIG. 8A is a cross-sectional view taken along a cutting line G-G' of FIG. 7. The cross-sectional view in FIG. 8A shows only the dashed portions of the cutting line G-G' in FIG. 7 while the dotted portion is not shown. As shown in FIGS. 7 and 8A, the first feature 330 is disposed in a first layer 370 over the substrate 360, and the first feature 330 extends only along a first longitudinal direction. The first feature 330 comprises a plurality of alignment segments 330a-330j substantially parallel to each other. The first feature 330 may comprise an isolation structure such as a shallow trench isolation (STI), a field oxide (FOX), a local-oxidation of silicon (LOCOS) feature, and/or other suitable isolation element. The isolation structure may comprise a dielectric material such as silicon oxide, silicon nitride, silicon oxy-nitride, fluoride-doped silicate (FSG), a low-k dielectric material, combinations thereof, and/or other suitable material. In some embodiments, the first longitudinal direction is an X direction.

FIG. 8B is a cross-sectional view taken along a cutting line H-H' of FIG. 7. The cross-sectional view in FIG. 8B shows only the dashed portions of the cutting line H-H' in FIG. 7 while the dotted portion is not shown. As shown in FIGS. 7 and 8B, the second feature 340 is disposed in a second layer 380 over the first layer 370, and the second feature 340 extends along a second longitudinal direction different from the first longitudinal direction. The second feature 340 comprises a plurality of alignment segments 340a-340j substantially parallel to each other. The second feature 340 may comprise a gate electrode. The gate electrode may be sacrificial, for example, such as formed in a replacement gate process. In some embodiments, the gate electrode includes polysilicon. The polysilicon may be formed by suitable deposition processes such as, for example, low-pressure chemical vapor deposition (LPCVD) and plasma-enhanced CVD (PECVD). In some embodiments, the gate electrode includes conductive material such as metal. In some embodiments, the second longitudinal direction is a Y direction substantially perpendicular to the X direction.

As depicted in FIGS. 7, 8A, and 8B, the third feature 320 is disposed in a third layer 390 over the second layer 380, and the third feature 320 extends along both the first longitudinal direction and the second longitudinal direction. The third feature 320 comprises a plurality of alignment segments 320a-320j substantially parallel to each other extending along the first longitudinal direction and a plurality of alignment segments 320a'-320j' substantially parallel to each other extending along the second longitudinal direction. The third feature 320 may comprise a plurality of openings 320a-320j and 320a'-320j' in a mask 310. The mask 310 may comprise a positive-tone or negative-tone photoresist such as polymer, or a hard mask such as silicon nitride or silicon oxy-nitride. The third layer 390 may be patterned using suitable photolithography processes such as, for example, forming a photoresist layer, exposing the photoresist layer to a pattern, baking and developing the photoresist to form the mask 310. The mask 310 may then be used to etch a pattern (e.g., a contact) into a dielectric layer 350 such as silicon oxide disposed below the mask 310. In some embodiments, the first longitudinal direction is substantially perpendicular to the second longitudinal direction. In some embodiments, the first longitudinal direction is the X direction and the second longitudinal direction is the Y direction substantially perpendicular to the X direction.

The overlay marks of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 9:
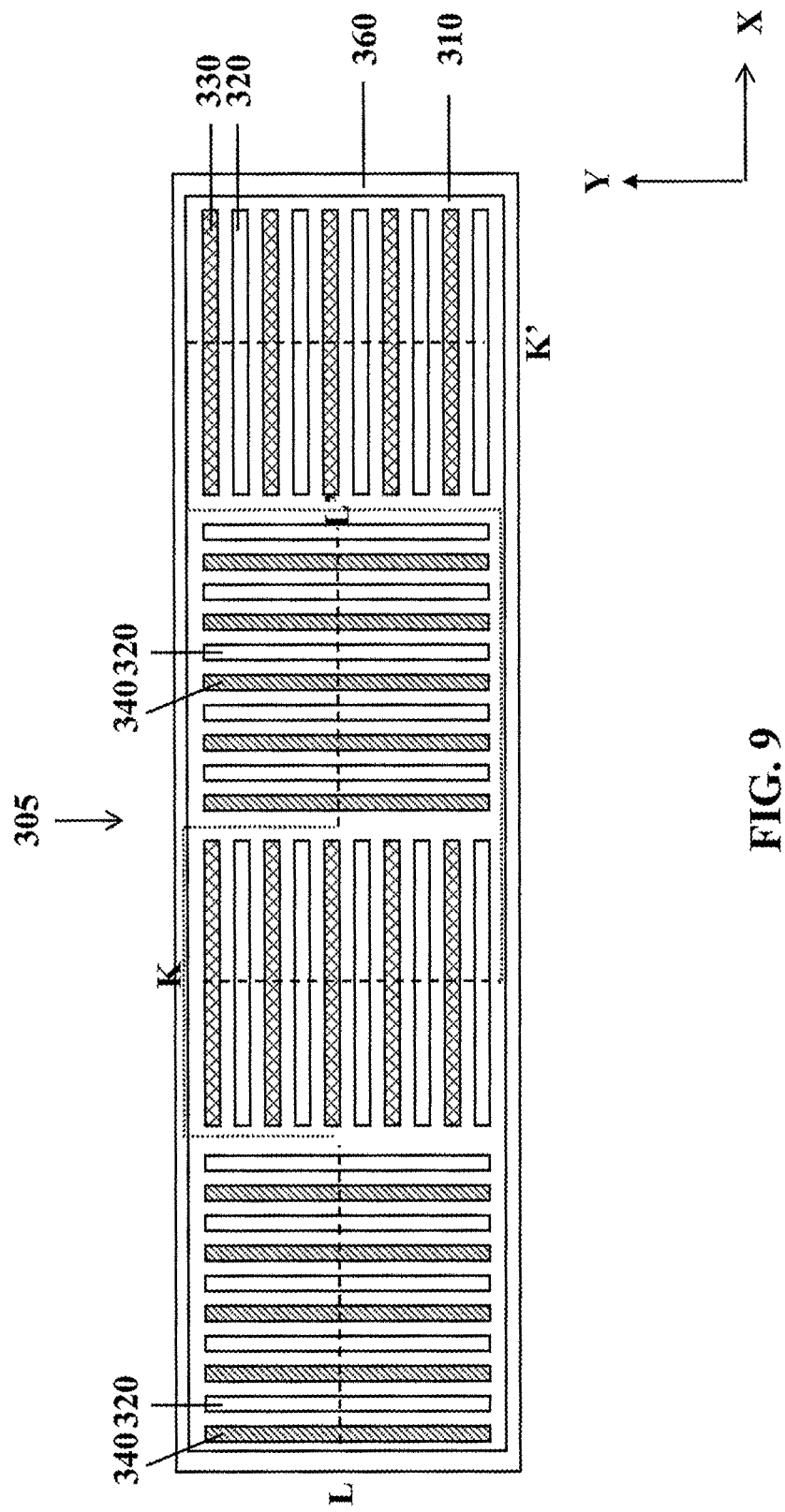
FIG. 9 is a top view of an overlay mark for aligning different layers over a substrate according to various aspects of the present disclosure.
Figure 10A:
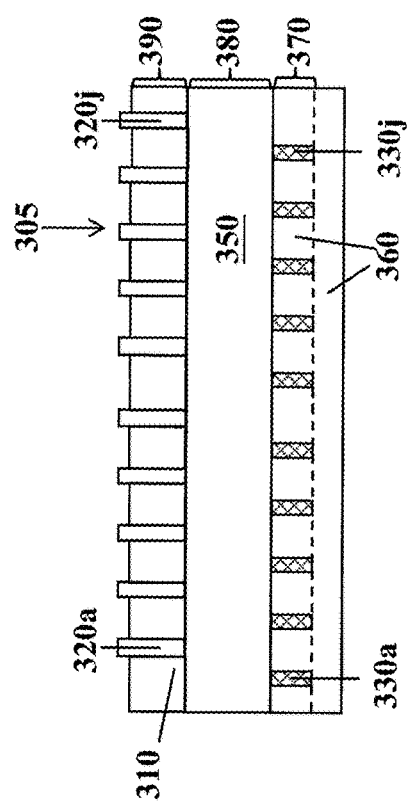
FIG. 10A is a cross-sectional view taken along a cutting line K-K' of FIG. 9.
Figure 10B:
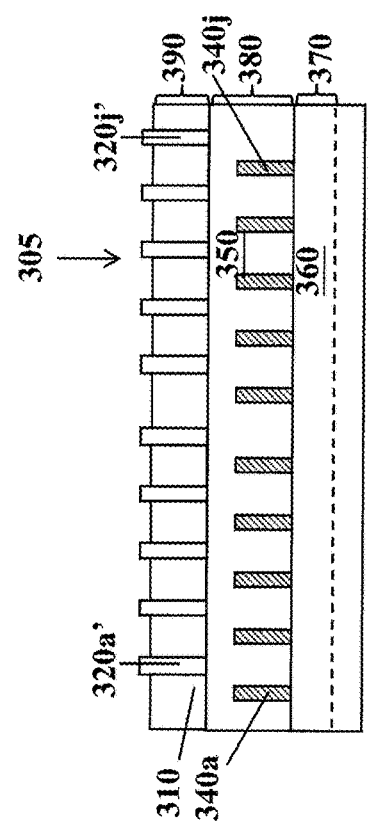
FIG. 10B is a cross-sectional view taken along a cutting line L-L' of FIG. 9.

FIG. 9 is a top view of an overlay mark 305 for aligning different layers over a substrate 360 according to various aspects of the present disclosure. FIG. 9 is similar to FIG. 7 except that the shape of the overlay mark 305 is rectangular compared to that of the overlay mark 300 being square. The overlay mark 305 may be located on the scribe lines at the four corners of the edge of each chip to save the area, or located inside each chip. FIG. 10A is a cross-sectional view taken along a cutting line K-K' of FIG. 9. FIG. 10A is similar to FIG. 8A, and the cross-sectional view in FIG. 10A shows only the dashed portions of the cutting line K-K' in FIG. 9 while the dotted portion is not shown. FIG. 10B is a cross-sectional view taken along a cutting line L-L' of FIG. 9. FIG. 10B is similar to FIG. 8B, and the cross-sectional view in FIG. 10B shows only the dashed portions of the cutting line L-L' in FIG. 9 while the dotted portion is not shown. The detailed description of FIGS. 9, 10A, and 10B for the overlay mark 305 may refer to that of FIGS. 7, 8A, and 8B for the overlay mark 300.

Figure 11:
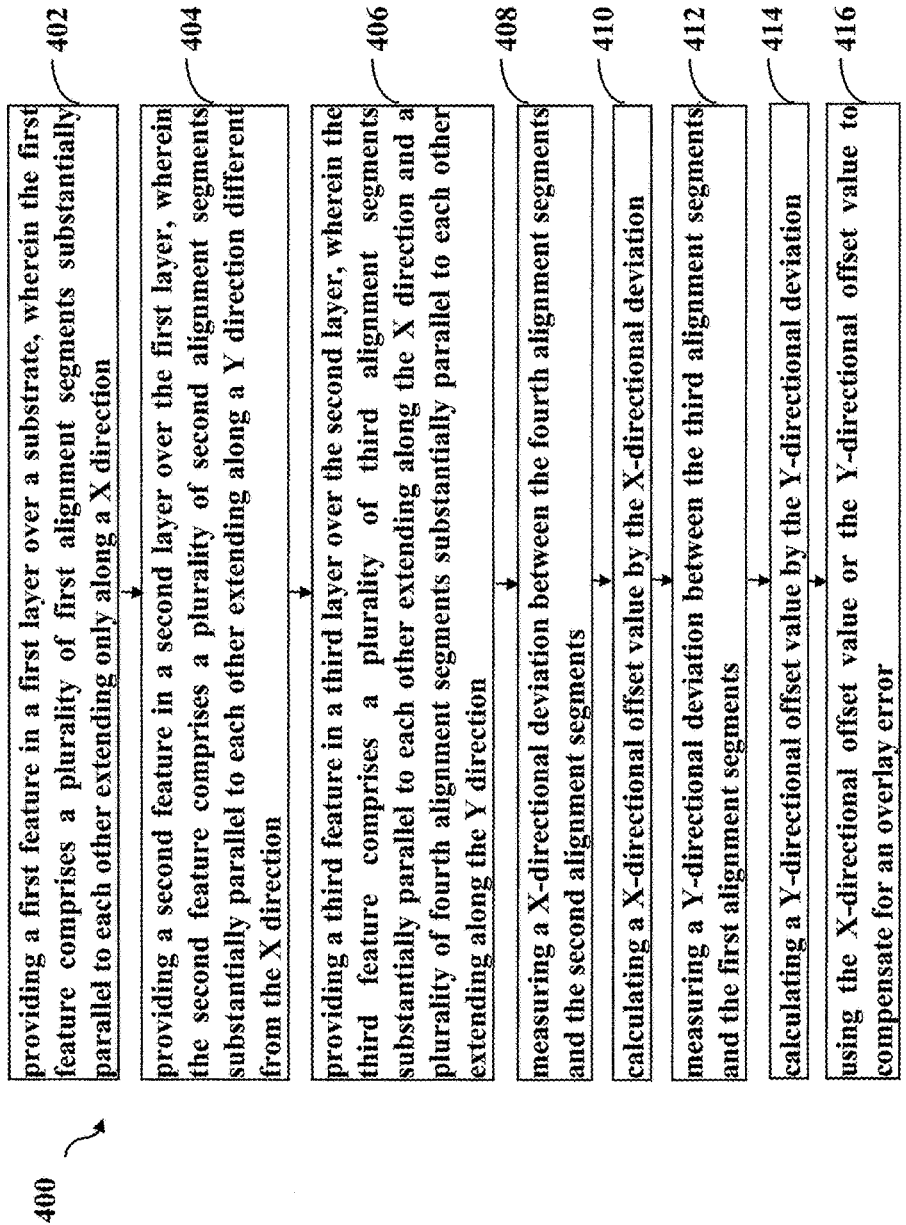
FIG. 11 is a flowchart of a method of adjusting multi-layer overlay alignment according to various aspects of the present disclosure.

FIG. 11 is a flowchart of a method 400 of adjusting multi-layer overlay alignment according to various aspects of the present disclosure. It is understood that additional steps can be provided before, during, and after the method 400, and some of the steps described can be replaced or eliminated for other embodiments of the method. The method 400 begins at step 402 in which a first feature in a first layer over a substrate is provided, wherein the first feature comprises a plurality of first alignment segments substantially parallel to each other extending only along an X direction. The method 400 continues with step 404 in which a second feature in a second layer over the first layer is provided, wherein the second feature comprises a plurality of second alignment segments substantially parallel to each other extending along a Y direction different from the X direction. The method 400 continues with step 406 in which a third feature in a third layer over the second layer is provided, wherein the third feature comprises a plurality of third alignment segments substantially parallel to each other extending along the X direction and a plurality of fourth alignment segments substantially parallel to each other extending along the Y direction. The method 400 continues with step 408 in which an X-directional deviation between the fourth alignment segments and the second alignment segments is measured. The method 400 continues with step 410 in which an X-directional offset value by the X-directional deviation is calculated. The method 400 continues with step 412 in which a Y-directional deviation between the third alignment segments and the first alignment segments is measured. The method 400 continues with step 414 in which a Y-directional offset value by the Y-directional deviation is calculated. The method 400 continues with step 416 in which the X-directional offset value or the Y-directional offset value is used to compensate for an overlay error. The method 400 may further comprise repeating a photolithography process if the overlay error is larger than an acceptable deviation. The discussion that follows illustrates embodiments of overlay marks that can be measured according to the method 400 of FIG. 11.

As depicted in FIGS. 3 and 4A, and step 402 in FIG. 11, the method 400 begins at step 402 by providing a first feature 130 in a first layer 170 over a substrate 160, wherein the first feature 130 comprises a plurality of first alignment segments 130a, 130b substantially parallel to each other extending only along an X direction. The first feature 130 may comprise an isolation structure such as a shallow trench isolation (STI), a field oxide (FOX), a local-oxidation of silicon (LOCOS) feature, and/or other suitable isolation element. The isolation structure may comprise a dielectric material such as silicon oxide, silicon nitride, silicon oxynitride, fluoride-doped silicate (FSG), a low-k dielectric material, combinations thereof, and/or other suitable material.

As depicted in FIGS. 3 and 4B, and step 404 in FIG. 11, the method 400 continues with step 404 by providing a second feature 140 in a second layer 180 over the first layer 170, wherein the second feature 140 comprises a plurality of second alignment segments 140a, 140b substantially parallel to each other extending along a Y direction different from the X direction. The second feature 140 may comprise a gate electrode. The gate electrode may be sacrificial, for example, such as formed in a replacement gate process. In some embodiments, the gate electrode includes polysilicon. The polysilicon may be formed by suitable deposition processes such as, for example, low-pressure chemical vapor deposition (LPCVD) and plasma-enhanced CVD (PECVD). In some embodiments, the gate electrode includes conductive material such as metal. In some embodiments, the Y direction is substantially perpendicular to the X direction.

As depicted in FIGS. 3, 4A, and 4B, and step 406 in FIG. 11, the method 400 continues with step 406 by providing a third feature 120 in a third layer 190 over the second layer 180, wherein the third feature 120 comprises a plurality of third alignment segments 120a, 120b substantially parallel to each other extending along the X direction and a plurality of fourth alignment segments 120c, 120d substantially parallel to each other extending along the Y direction. The third feature 120 may comprise a continuous opening or a plurality of openings 120a-120d in a mask 110. The mask 110 may comprise a positive-tone or negative-tone photoresist such as polymer, or a hard mask such as silicon nitride or silicon oxy-nitride. The third layer 190 may be patterned using suitable photolithography processes such as, for example, forming a photoresist layer, exposing the photoresist layer to a pattern, baking and developing the photoresist to form the mask 110. The mask 110 may then be used to etch a pattern (e.g., a contact) into a dielectric layer 150 such as silicon oxide disposed below the mask 110. In some embodiments, the third feature 120 comprises four alignment segments 120a-120d forming a rectangular pattern or a square pattern. In some embodiments, the X direction is substantially perpendicular to the Y direction.

Figure 12B:
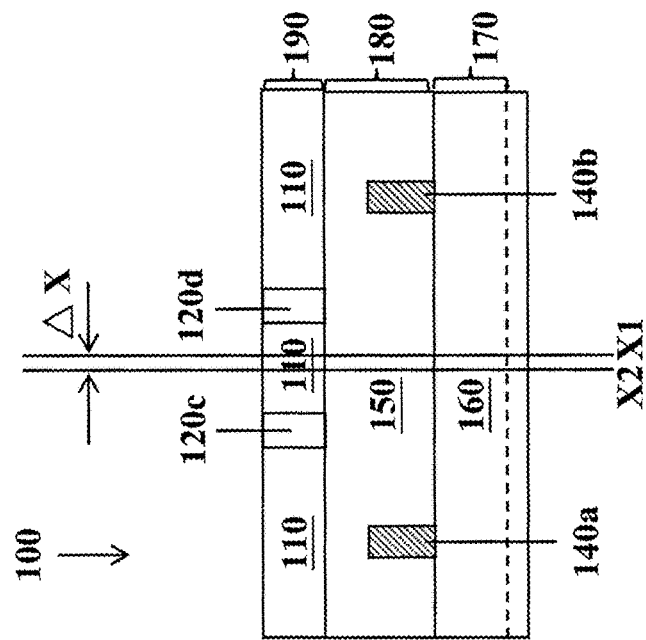
FIG. 12B is a cross-sectional view taken along a cutting line B-B' of FIG. 3, including two centerlines X1 and X2.
Figure 13B:
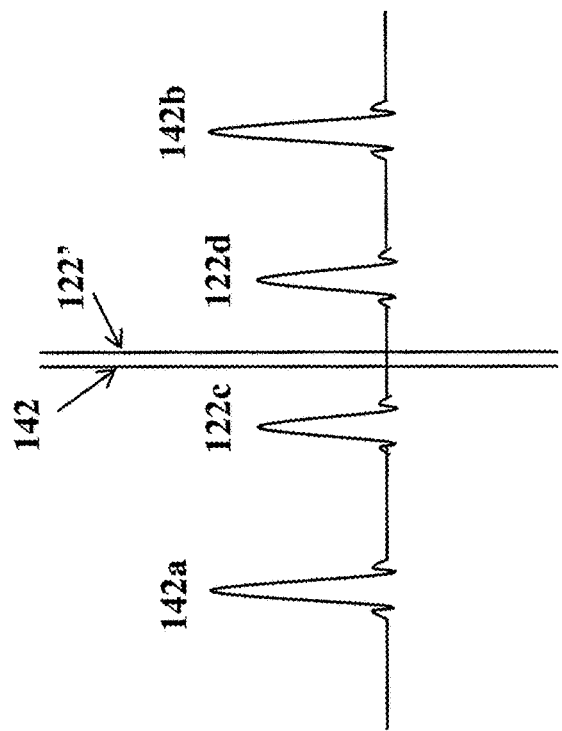
FIG. 13B is a signal waveform measured from the overlay mark in FIG. 12B.

FIG. 12B is a cross-sectional view taken along a cutting line B-B' of FIG. 3, including two centerlines X1 and X2. FIG. 13B is a signal waveform measured from the overlay mark 100 in FIG. 12B. As depicted in FIGS. 12B and 13B, and step 408 in FIG. 11, the method 400 continues with step 408 by measuring an X-directional deviation ($\Delta X$) between the fourth alignment segments 120c, 120d and the second alignment segments 140a, 140b. Peak signals of the second alignment segments 140a, 140b in FIG. 12B are denoted as 142a and 142b in FIG. 13B, and the peak signals of the fourth alignment segments 120c, 120d in FIG. 12B are denoted as 122c and 122d in FIG. 13B. Using the overlay mark 100 to measure the alignment accuracy, a first mean value 122' of the peak signals 122c and 122d is obtained. A second mean value 142 of the peak signals 142a and 142b is also obtained. A difference between the first mean value 122' and the second mean value 142 is calculated as the X-directional deviation ($\Delta X$) between the fourth alignment segments 120c, 120d and the second alignment segments 140a, 140b.

Figure 14A:
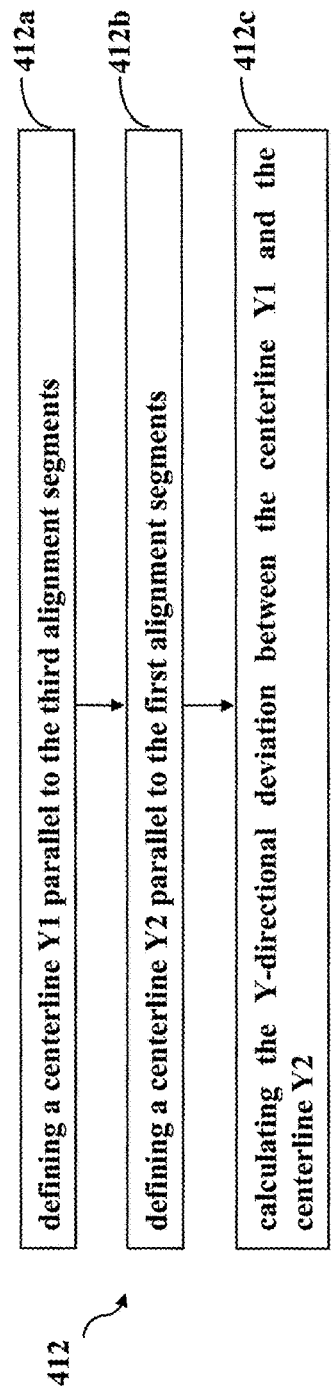
FIG. 14A shows the detail of sub-steps 412*a*, 412*b*, and 412*c* of step 412 in FIG. 11.
Figure 14B:
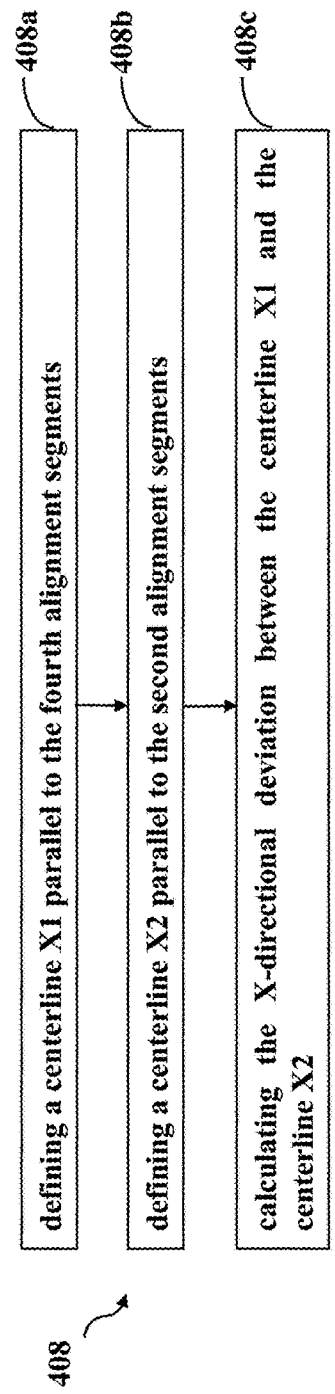
FIG. 14B shows the detail of sub-steps 408*a*, 408*b*, and 408*c* of step 408 in FIG. 11.

In some embodiments, step 408 may comprise several sub-steps 408a, 408b, and 408c. FIG. 14B shows the detail of sub-steps 408a-408c of step 408 in FIG. 11. As depicted in FIGS. 12B and 13B, and sub-steps 408a-408c in FIG. 14B, the first mean value 122' defines the centerline X1 parallel to the fourth alignment segments 120c, 120d. The second mean value 142 defines the centerline X2 parallel to the second alignment segments 140a, 140b. The difference between the first mean value 122' and the second mean value 142 is calculated as the X-directional deviation ($\Delta X$) between the centerline X1 and the centerline X2. As depicted in step 410 in FIG. 11, the method 400 continues with step 410 by calculating an X-directional offset value by the X-directional deviation ($\Delta X$). The X-directional offset value is the reverse of the X-directional deviation ($\Delta X$), or any value appropriate for adjusting the X-directional deviation ($\Delta X$).

Figure 12A:
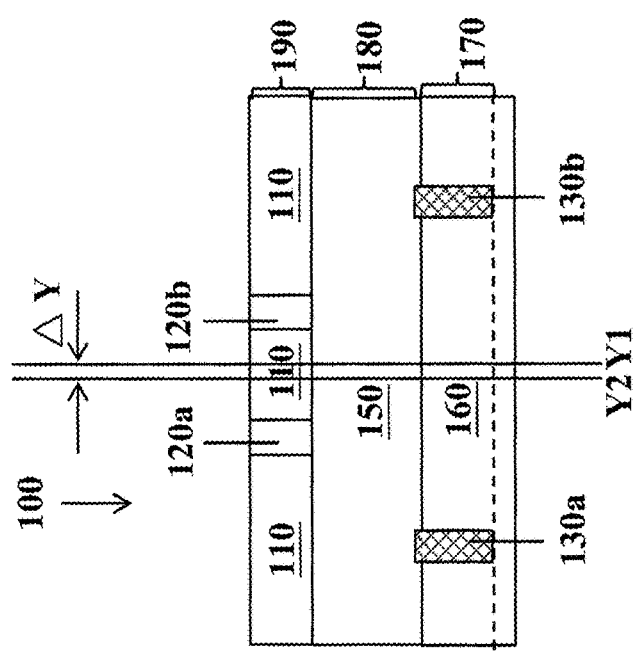
FIG. 12A is a cross-sectional view taken along a cutting line A-A' of FIG. 3, including two centerlines Y1 and Y2.
Figure 13A:
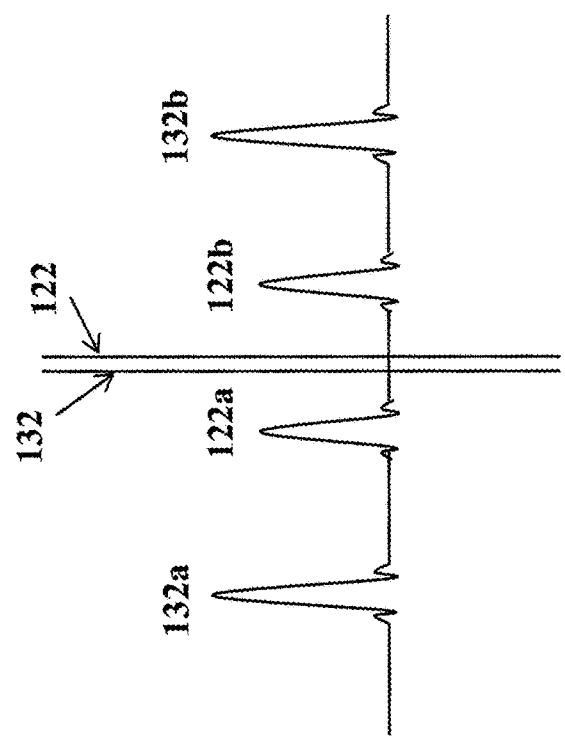
FIG. 13A is a signal waveform measured from the overlay mark in FIG. 12A.

FIG. 12A is a cross-sectional view taken along a cutting line A-A' of FIG. 3, including two centerlines Y1 and Y2. FIG. 13A is a signal waveform measured from the overlay mark 100 in FIG. 12A. As depicted in FIGS. 12A and 13A, and step 412 in FIG. 11, the method 400 continues with step 412 by measuring a Y-directional deviation ($\Delta Y$) between the third alignment segments 120a, 120b and the first alignment segments 130a, 130b. The peak signals of the first alignment segments 130a, 130b in FIG. 12A are denoted as 132a and 132b in FIG. 13A, and the peak signals of the third alignment segments 120a, 120b in FIG. 12A are denoted as 122a and 122b in FIG. 13A. Using the overlay mark 100 to measure the alignment accuracy, a third mean value 122 of the peak signals 122a and 122b is obtained. A fourth mean value 132 of the peak signals 132a and 132b is also obtained. A difference between the third mean value 122 and the fourth mean value 132 is calculated as the Y-directional deviation (ΔY) between the third alignment segments 120a, 120b and the first alignment segments 130a, 130b.

In some embodiments, step 412 may comprise several sub-steps 412a, 412b, and 412c. FIG. 14A shows the detail of sub-steps 412a-412c of step 412 in FIG. 11. As depicted in FIGS. 12A and 13A, and sub-steps 412a-412c in FIG. 14A, the third mean value 122 defines the centerline Y1 parallel to the third alignment segments 120a, 120b. The fourth mean value 132 defines the centerline Y2 parallel to the first alignment segments 130a, 130b. The difference between the third mean value 122 and the fourth mean value 132 is calculated as the Y-directional deviation (ΔY) between the centerline Y1 and the centerline Y2. As depicted in step 414 in FIG. 11, the method 400 continues with step 414 by calculating a Y-directional offset value by the Y-directional deviation (ΔY). The Y-directional offset value is the reverse of the Y-directional deviation (ΔY), or any value appropriate for adjusting the Y-directional deviation (ΔY).

As depicted in step 416 in FIG. 11, the method 400 continues with step 416 by using the X-directional offset value and/or the Y-directional offset value to compensate for an overlay error. The overlay error may comprise the X-directional deviation (ΔX), the Y-directional deviation (ΔY), or the combination of both. After the overlay error is compensated, the multi-layer overlay alignment accuracy (AA) is adjusted and will be implemented in next run of the photolithography process. In some embodiments, the method 400 may further comprise repeating a photolithography process if the overlay error is larger than an acceptable deviation. If the overlay error is larger than an acceptable deviation, the alignment between the third feature 120 and the first feature 130, and/or the alignment between the third feature 120 and the second feature 140, do/does not reach the required accuracy. Consequently, the third feature 120 has to be removed, and the photolithography process has to be repeated until the overlay error is no larger than the acceptable deviation.

In various embodiments, the method 400 may be used with the overlay mark 200 of FIGS. 5 and 6A-6D. As depicted in FIGS. 5 and 6A, and step 402 in FIG. 11, the method 400 begins at step 402 by providing a first feature 230 in a first layer 270 over a substrate 260, wherein the first feature 230 comprises a plurality of first alignment segments 230a-230t substantially parallel to each other extending only along an X direction. The first feature 230 may comprise an isolation structure such as a shallow trench isolation (STI), a field oxide (FOX), a local-oxidation of silicon (LOCOS) feature, and/or other suitable isolation element. The isolation structure may comprise a dielectric material such as silicon oxide, silicon nitride, silicon oxy-nitride, fluoride-doped silicate (FSG), a low-k dielectric material, combinations thereof, and/or other suitable material.

As depicted in FIGS. 5 and 6B, and step 404 in FIG. 11, the method 400 continues with step 404 by providing a second feature 240 in a second layer 280 over the first layer 270, wherein the second feature 240 comprises a plurality of second alignment segments 240a-240t substantially parallel to each other extending along a Y direction different from the X direction. The second feature 240 may comprise a gate electrode. The gate electrode may be sacrificial, for example, such as formed in a replacement gate process. In some embodiments, the gate electrode includes polysilicon. The polysilicon may be formed by suitable deposition processes such as, for example, low-pressure chemical vapor deposition (LPCVD) and plasma-enhanced CVD (PECVD). In some embodiments, the gate electrode includes conductive material such as metal. In some embodiments, the Y direction is substantially perpendicular to the X direction.

As depicted in FIGS. 5, 6C, and 6D, and step 406 in FIG. 11, the method 400 continues with step 406 by providing a third feature 220 in a third layer 290 over the second layer 280, wherein the third feature 220 comprises a plurality of third alignment segments 220a-220t substantially parallel to each other extending along the X direction and a plurality of fourth alignment segments 220a'-220t' substantially parallel to each other extending along the Y direction. The third feature 220 may comprise a plurality of openings 220a-220t and 220a'-220t' in a mask 210. The mask 210 may comprise a positive-tone or negative-tone photoresist such as polymer, or a hard mask such as silicon nitride or silicon oxy-nitride. The third layer 290 may be patterned using suitable photolithography processes such as, for example, forming a photoresist layer, exposing the photoresist layer to a pattern, baking and developing the photoresist to form the mask 210. The mask 210 may then be used to etch a pattern (e.g., a contact) into a dielectric layer 250 such as silicon oxide disposed below the mask 210. In some embodiments, the X direction is substantially perpendicular to the Y direction.

Figure 15A:
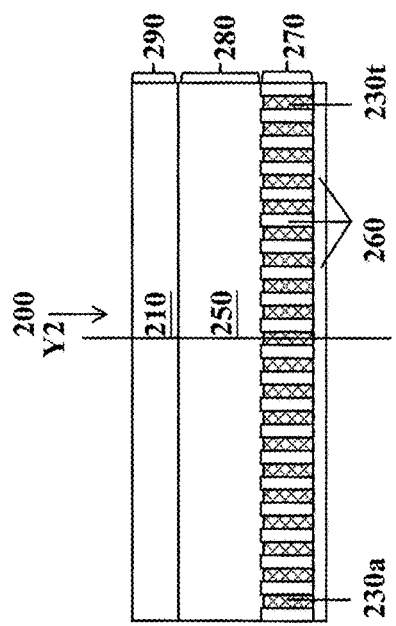
FIG. 15A is a cross-sectional view taken along a cutting line C-C' of FIG. 5, including a centerline Y2.
Figure 15B:
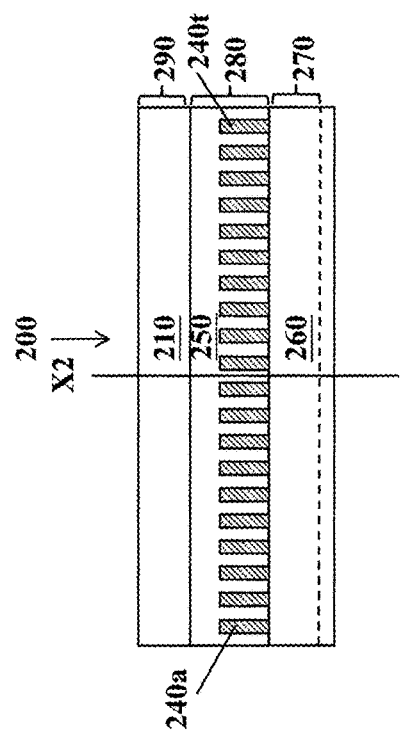
FIG. 15B is a cross-sectional view taken along a cutting line D-D' of FIG. 5, including a centerline X2.

FIG. 15B is a cross-sectional view taken along a cutting line D-D' of FIG. 5, including a centerline X2, and FIG. 16B is a signal waveform measured from the overlay mark 200 in FIG. 15B. FIG. 15D is a cross-sectional view taken along a cutting line F-F' of FIG. 5, including a centerline X1, and FIG. 16D is a signal waveform measured from the overlay mark 200 in FIG. 15D. As depicted in FIGS. 15B, 15D, 16B, and 16D, and step 408 in FIG. 11, the method 400 continues with step 408 by measuring an X-directional deviation (ΔX) between the fourth alignment segments 220a'-220t' and the second alignment segments 240a-240t. The peak signals of the second alignment segments 240a-240t in FIG. 15B are denoted as 242a-242t in FIG. 16B, and the peak signals of the fourth alignment segments 220a'-220t' in FIG. 15D are denoted as 222a'-222t' in FIG. 16D. Using the overlay mark 200 to measure the alignment accuracy, a first mean value 222' of the peak signals 222a'-222t' is obtained. A second mean value 242 of the peak signals 242a-242t is also obtained. A difference between the first mean value 222' and the second mean value 242 is calculated as the X-directional deviation (ΔX) between the fourth alignment segments 220a'-220t' and the second alignment segments 240a-240t.

In some embodiments, step 408 may comprise several sub-steps 408a, 408b, and 408c. FIG. 14B shows the detail of sub-steps 408a-408c of step 408 in FIG. 11. As depicted in FIGS. 15B, 15D, 16B, and 16D, and sub-steps 408a-408c in FIG. 14B, the first mean value 222' defines the centerline X1 parallel to the fourth alignment segments 220a'-220t'. The second mean value 242 defines the centerline X2 parallel to the second alignment segments 240a-240t. The difference between the first mean value 222' and the second mean value 242 is calculated as the X-directional deviation (ΔX) between the centerline X1 and the centerline X2. As depicted in step 410 in FIG. 11, the method 400 continues with step 410 by calculating an X-directional offset value by the X-directional deviation (ΔX). The X-directional offset value is the reverse of the X-directional deviation (ΔX), or any value appropriate for adjusting the X-directional deviation (ΔX).

FIG. 15A is a cross-sectional view taken along a cutting line C-C' of FIG. 5, including a centerline Y2, and FIG. 16A is a signal waveform measured from the overlay mark 200 in FIG. 15A. FIG. 15C is a cross-sectional view taken along a cutting line E-E' of FIG. 5, including a centerline Y1, and FIG. 16C is a signal waveform measured from the overlay mark 200 in FIG. 15C. As depicted in FIGS. 15A, 15C, 16A, and 16C, the method 400 continues with step 412 by measuring a Y-directional deviation (ΔY) between the third alignment segments 220a-220t and the first alignment segments 230a-230t. The peak signals of the first alignment segments 230a-230t in FIG. 15A are denoted as 232a-232t in FIG. 16A, and the peak signals of the third alignment segments 220a-220t in FIG. 15C are denoted as 222a-222t in FIG. 16C. Using the overlay mark 200 to measure the alignment accuracy, a third mean value 222 of the peak signals 222a-222t is obtained. A fourth mean value 232 of the peak signals 232a-232t is also obtained. A difference between the third mean value 222 and the fourth mean value 232 is calculated as the Y-directional deviation (ΔY) between the third alignment segments 220a-220t and the first alignment segments 230a-230t.

In some embodiments, step 412 may comprise several sub-steps 412a, 412b, and 412c. FIG. 14A shows the detail of sub-steps 412a-412c of step 412 in FIG. 11. As depicted in FIGS. 15A, 15C, 16A, and 16C, and sub-steps 412a-412c in FIG. 14A, the third mean value 222 defines the centerline Y1 parallel to the third alignment segments 220a-220t. The fourth mean value 232 defines the centerline Y2 parallel to the first alignment segments 230a-230t. The difference between the third mean value 222 and the fourth mean value 232 is calculated as the Y-directional deviation (ΔY) between the centerline Y1 and the centerline Y2. As depicted in step 414 in FIG. 11, the method 400 continues with step 414 by calculating a Y-directional offset value by the Y-directional deviation (ΔY). The Y-directional offset value is the reverse of the Y-directional deviation (ΔY), or any value appropriate for adjusting the Y-directional deviation (ΔY).

As depicted in step 416 in FIG. 11, the method 400 continues with step 416 by using the X-directional offset value and/or the Y-directional offset value to compensate for an overlay error. The overlay error may comprise the X-directional deviation (ΔX), the Y-directional deviation (ΔY), or the combination of both. After the overlay error is compensated, the multi-layer overlay alignment accuracy (AA) is adjusted and will be implemented in next run of the photolithography process. In some embodiments, the method 400 may further comprise repeating a photolithography process if the overlay error is larger than an acceptable deviation. If the overlay error is larger than an acceptable deviation, the alignment between the third feature 220 and the first feature 230, and/or the alignment between the third feature 220 and the second feature 240, do/does not reach the required accuracy. Consequently, the third feature 220 has to be removed, and the photolithography process has to be repeated until the overlay error is no larger than the acceptable deviation.

In various embodiments, the method 400 may be used with the overlay mark 300 of FIGS. 7, 8A, and 8B. As depicted in FIGS. 7 and 8A, and step 402 in FIG. 11, the method 400 begins at step 402 by providing a first feature 330 in a first layer 370 over a substrate 360, wherein the first feature 330 comprises a plurality of first alignment segments 330a-330j substantially parallel to each other extending only along an X direction. The first feature 330 may comprise an isolation structure such as a shallow trench isolation (STI), a field oxide (FOX), a local-oxidation of silicon (LOCOS) feature, and/or other suitable isolation element. The isolation structure may comprise a dielectric material such as silicon oxide, silicon nitride, silicon oxy-nitride, fluoride-doped silicate (FSG), a low-k dielectric material, combinations thereof, and/or other suitable material.

As depicted in FIGS. 7 and 8B, and step 404 in FIG. 11, the method 400 continues with step 404 by providing a second feature 340 in a second layer 380 over the first layer 370, wherein the second feature 340 comprises a plurality of second alignment segments 340a-340j substantially parallel to each other extending along a Y direction different from the X direction. The second feature 340 may comprise a gate electrode. The gate electrode may be sacrificial, for example, such as formed in a replacement gate process. In some embodiments, the gate electrode includes polysilicon. The polysilicon may be formed by suitable deposition processes such as, for example, low-pressure chemical vapor deposition (LPCVD) and plasma-enhanced CVD (PECVD). In some embodiments, the gate electrode includes conductive material such as metal. In some embodiments, the Y direction is substantially perpendicular to the X direction.

As depicted in FIGS. 7, 8A, and 8B, and step 406 in FIG. 11, the method 400 continues with step 406 by providing a third feature 320 in a third layer 390 over the second layer 380, wherein the third feature 320 comprises a plurality of third alignment segments 320a-320j substantially parallel to each other extending along the X direction and a plurality of fourth alignment segments 320a'-320j' substantially parallel to each other extending along the Y direction. The third feature 320 may comprise a plurality of openings 320a-320j and 320a'-320j' in a mask 310. The mask 310 may comprise a positive-tone or negative-tone photoresist such as polymer, or a hard mask such as silicon nitride or silicon oxy-nitride. The third layer 390 may be patterned using suitable photolithography processes such as, for example, forming a photoresist layer, exposing the photoresist layer to a pattern, baking and developing the photoresist to form the mask 310. The mask 310 may then be used to etch a pattern (e.g., a contact) into a dielectric layer 350 such as silicon oxide disposed below the mask 310. In some embodiments, the X direction is substantially perpendicular to the Y direction.

Figure 17A:
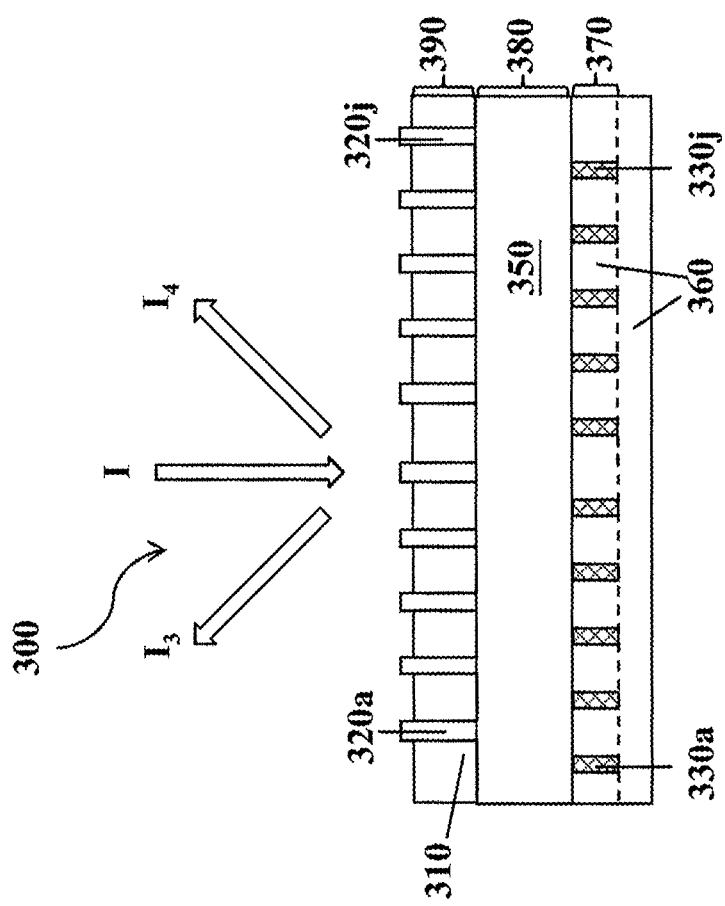
FIG. 17A is a cross-sectional view taken along a cutting line G-G' of FIG. 7, including an intensity I of an incident light and intensities $I_3$ and $I_4$ of a first order diffraction.
Figure 17B:
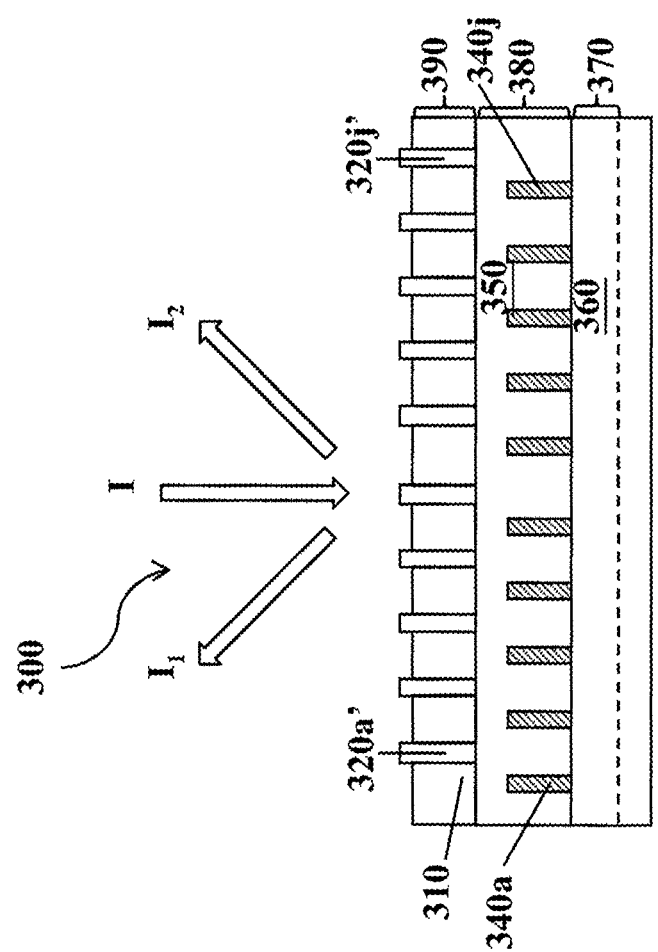
FIG. 17B is a cross-sectional view taken along a cutting line H-H' of FIG. 7, including an intensity I of an incident light and intensities $I_1$ and $I_2$ of a first order diffraction.
Figure 18A:
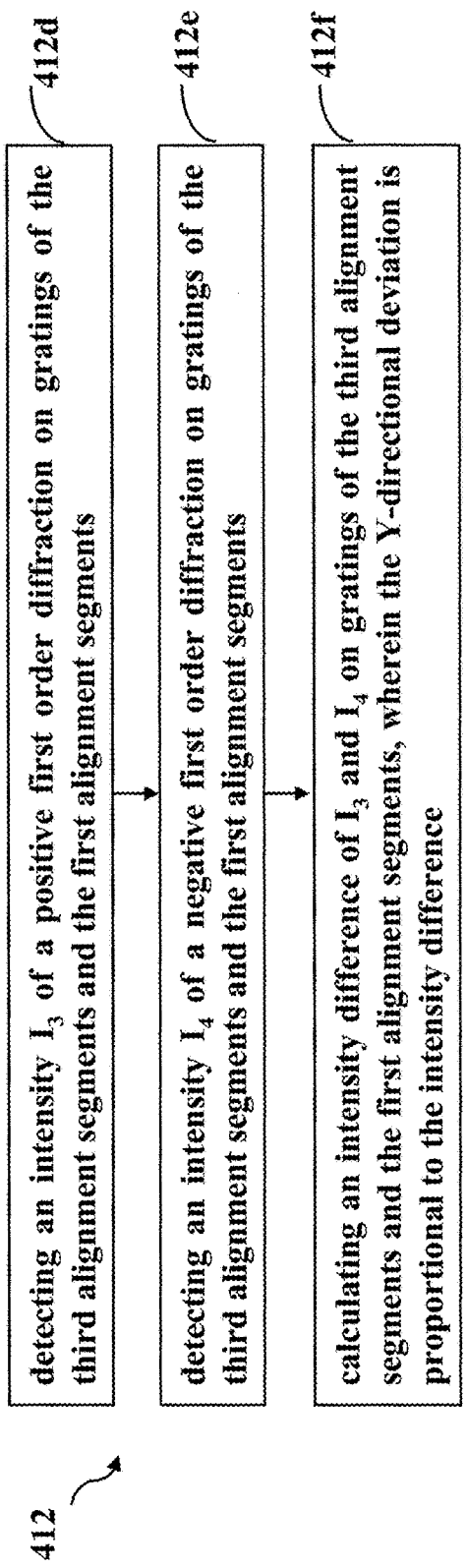
FIG. 18A shows the detail of sub-steps 412*d*, 412*e*, and 412*f* of step 412 in FIG. 11.
Figure 18B:
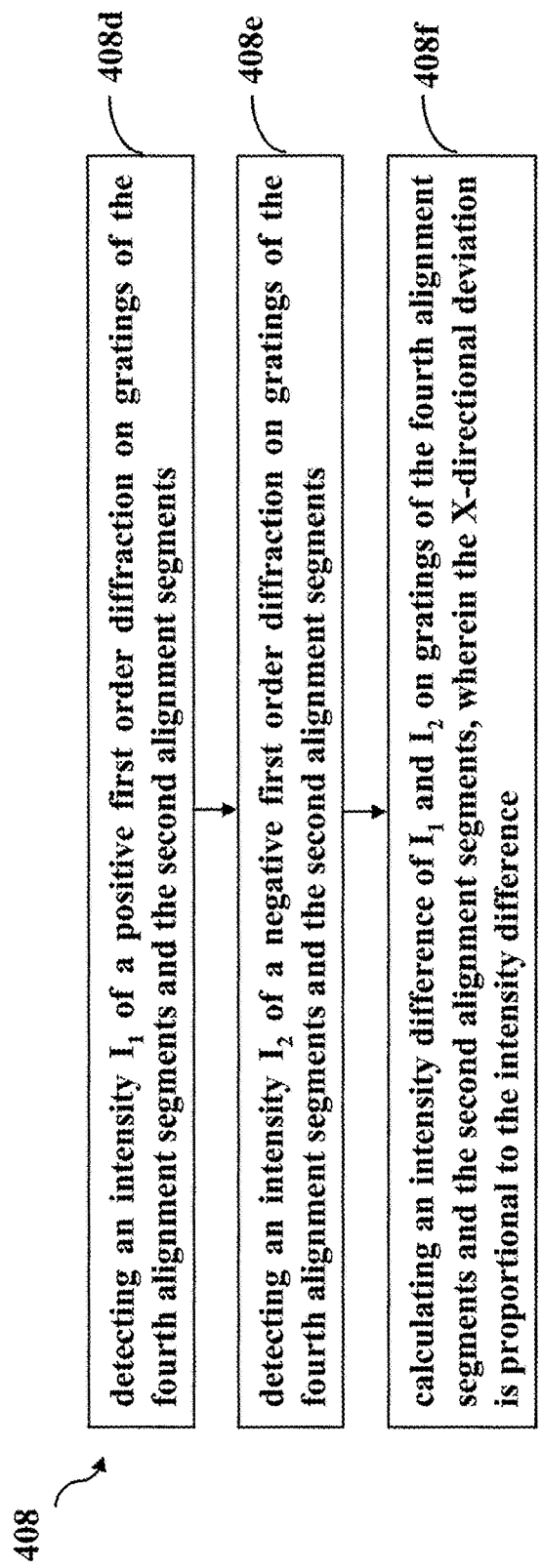
FIG. 18B shows the detail of sub-steps 408d, 408e, and 408f of step 408 in FIG. 11.

FIG. 17B is a cross-sectional view taken along a cutting line H-H' of FIG. 7, including an intensity I of an incident light and intensities $I_1$ and $I_2$ of a first order diffraction. As depicted in FIG. 17B and step 408 in FIG. 11, the method 400 continues with step 408 by measuring an X-directional deviation (ΔX) between the fourth alignment segments 320a'-320j' and the second alignment segments 340a-340j. The overlay measurement principle used here is based on measuring asymmetry via the detection of first or higher order diffraction. In some embodiments, step 408 may comprise several sub-steps 408d, 408e, and 408f. FIG. 18B shows the detail of sub-steps 408d-408f of step 408 in FIG. 11. As depicted in FIG. 17B, and sub-steps 408d-408f in FIG. 18B, an intensity $I_1$ of a positive first order diffraction on gratings of the fourth alignment segments 320a'-320j' and the second alignment segments 340a-340j is detected. An intensity $I_2$ of a negative first order diffraction on gratings of the fourth alignment segments 320a'-320j' and the second alignment segments 340a-340j, is also detected. An intensity difference of $I_1$ and $I_2$ on gratings of the fourth alignment segments 320a'-320j' and the second alignment segments 340a-340j is calculated, wherein the X-directional deviation (ΔX) is proportional to the intensity difference.

If gratings of the fourth alignment segments 320a'-320j' and the second alignment segments 340a-340j were on top of each other, forming one grating, the intensity $I_1$ of the positive first order diffraction and the intensity $I_2$ of the negative first order diffraction would be the same, then there would be no X-directional deviation ($\Delta X$) between the fourth alignment segments 320a'-320j' and the second alignment segments 340a-340j. If there is any misalignment between these two gratings, this will induce an asymmetry A (i.e. the intensity difference) between the intensities of $I_1$ and $I_2$, which is proportional to the X-directional deviation ($\Delta X$). This relationship could be expressed as one equation $A=I_1-I_2=K*\Delta X$. In order to determine $\Delta X$, the proportionality factor K needs to be determined first. To solve this problem, gratings are shifted with respect to each other by a distance d. If there was no $\Delta X$, there would be gratings with a relative shift +d yielding an asymmetry $A_1=K*d$ and gratings with a relative shift –d yielding an asymmetry $A_2=-K*d$. In the presence of $\Delta X$, the relative shifts of gratings amount to $\Delta X+d$ and $\Delta X-d$, yielding asymmetries $A_1=K*(\Delta X+d)$ and $A_2=K*(\Delta X-d)$. With these two equations, one may find $\Delta X=d*(A_1+A_2)/(A_1-A_2)$. So the X-directional deviation ($\Delta X$) is obtained. As depicted in step 410 in FIG. 11, the method 400 continues with step 410 by calculating an X-directional offset value by the X-directional deviation ($\Delta X$). The X-directional offset value is the reverse of the X-directional deviation ($\Delta X$), or any value appropriate for adjusting the X-directional deviation ($\Delta X$).

FIG. 17A is a cross-sectional view taken along a cutting line G-G' of FIG. 7, including an intensity I of an incident light and intensities I3 and I4 of a first order diffraction. As depicted in FIG. 17A and step 412 in FIG. 11, the method 400 continues with step 412 by measuring a Y-directional deviation ($\Delta Y$) between the third alignment segments 320a-320j and the first alignment segments 330a-330j. The overlay measurement principle used here is based on measuring asymmetry via the detection of first or higher order diffraction. In some embodiments, step 412 may comprise several sub-steps 412d, 412e, and 412f FIG. 18A shows the detail of sub-steps 412d-412f of step 412 in FIG. 11. As depicted in FIG. 17A, and sub-steps 412d-412f in FIG. 18A, an intensity $I_3$ of a positive first order diffraction on gratings of the third alignment segments 320a-320j and the first alignment segments 330a-330j is detected. An intensity $I_4$ of a negative first order diffraction on gratings of the third alignment segments 320a-320j and the first alignment segments 330a-330j is also detected. An intensity difference of $I_3$ and $I_4$ on gratings of the third alignment segments 320a-320j and the first alignment segments 330a-330j is calculated, wherein the Y-directional deviation ($\Delta Y$) is proportional to the intensity difference.

If gratings of the third alignment segments 320a-320j and the first alignment segments 330a-330j were on top of each other, forming one grating, the intensity $I_3$ of the positive first order diffraction and the intensity $I_4$ of the negative first order diffraction would be the same, then there would be no Y-directional deviation ($\Delta Y$) between the third alignment segments 320a-320j and the first alignment segments 330a-330j. If there is any misalignment between these two gratings, this will induce an asymmetry A' (i.e. the intensity difference) between the intensities of $I_3$ and $I_4$, which is proportional to the Y-directional deviation ($\Delta Y$). This relationship could be expressed as one equation $A'=I_3-I_4=K'*\Delta Y$. In order to determine $\Delta Y$, the proportionality factor K' needs to be determined first. To solve this problem, gratings are shifted with respect to each other by a distance d'. If there was no $\Delta Y$, there would be gratings with a relative shift +d' yielding an asymmetry $A_3=K'*d'$ and gratings with a relative shift –d' yielding an asymmetry $A_4=-K'*d'$. In the presence of $\Delta Y$, the relative shifts of gratings amount to $\Delta Y+d'$ and $\Delta Y-d'$, yielding asymmetries $A_3=K'*(\Delta Y+d')$ and $A_4=K'*(\Delta Y-d')$. With these two equations, one may find $\Delta Y=d'*(A_3+A_4)/(A_3-A_4)$. So the Y-directional deviation ($\Delta Y$) is obtained. As depicted in step 414 in FIG. 11, the method 400 continues with step 414 by calculating a Y-directional offset value by the Y-directional deviation ($\Delta Y$). The Y-directional offset value is the reverse of the Y-directional deviation ($\Delta Y$), or any value appropriate for adjusting the Y-directional deviation ($\Delta Y$).

As depicted in step 416 in FIG. 11, the method 400 continues with step 416 by using the X-directional offset value and/or the Y-directional offset value to compensate for an overlay error. The overlay error may comprise the X-directional deviation ($\Delta X$), the Y-directional deviation ($\Delta Y$), or the combination of both. After the overlay error is compensated, the multi-layer overlay alignment accuracy (AA) is adjusted and will be implemented in next run of the photolithography process. In some embodiments, the method 400 may further comprise repeating a photolithography process if the overlay error is larger than an acceptable deviation. If the overlay error is larger than an acceptable deviation, the alignment between the third feature 320 and the first feature 330, and/or the alignment between the third feature 320 and the second feature 340, do/does not reach the required accuracy. Consequently, the third feature 320 has to be removed, and the photolithography process has to be repeated until the overlay error is no larger than the acceptable deviation.

In various embodiments, the method 400 may be used with the overlay mark 305 of FIGS. 9, 10A, and 10B. As mentioned earlier, the detailed description of FIGS. 9, 10A, and 10B for the overlay mark 305 may refer to that of FIGS. 7, 8A, and 8B for the overlay mark 300. Thus, the method 400 used with overlay mark 305 may also refer to the method 400 used with overlay mark 300.

The overlay mark and method of the present disclosure are not limited to be used by a planar device on the substrate and can also be applied to a non-planar device such as a fin-like field effect transistor (FinFET). By using the overlay mark and method of the present disclosure, the accuracy of multi-layer overlay alignment is enhanced. Area cost required by the overlay mark of the present disclosure is lower than that of the prior approach since the features of different layers for checking alignment accuracy are positioned on the same area of the substrate. Also, time consumed by the method of the present disclosure is less than that of the prior approach because the method collects and analyzes the data which are really concerned. For example, the Y-directional deviation may be more concerned than the X-directional deviation for checking the alignment accuracy between the first layer and the third layer, while the X-directional deviation may be more concerned than the Y-directional deviation for checking the alignment accuracy between the second layer and the third layer. So, the method tends to focus on the X-directional deviation between the second layer and the third layer, and the Y-directional deviation between the first layer and the third layer. As a result, the area cost and the time consumption can be reduced by using the overlay mark and method of the present disclosure.

An aspect of this description relates to a method of forming an overlay mark. The method includes disposing a first feature in a first layer. The first feature includes a plurality of first alignment segments extending along a first direction. The method further includes disposing a second feature in a second layer over the first layer. The second feature includes a plurality of second alignment segments extending along a second direction different from the first direction. The method further includes patterning a third layer over the second layer to form a third feature in the third layer. The third feature includes a plurality of third alignment segments extending along the first direction and a plurality of fourth alignment segments extending along the second direction. In a plan view, each first alignment segment of the plurality of first alignment segments is adjacent to a corresponding third alignment segment of the plurality of third alignment segments along the first direction, and each second alignment segment of the plurality of second alignment segments is adjacent to a corresponding fourth alignment segment of the plurality of fourth alignment segments along the second direction. In some embodiments, disposing the first feature in the first layer includes forming the plurality of first alignment segments substantially parallel to each other. In some embodiments, disposing the first feature in the first layer includes forming a plurality of isolation structures extending along the first direction. In some embodiments, disposing the second feature in the second layer includes forming the plurality of second alignment segments substantially parallel to each other. In some embodiments, disposing the second feature in the second layer includes forming a plurality of gate electrodes extending along the second direction. In some embodiments, the first direction is substantially perpendicular to the second direction. In some embodiments, patterning the third layer to form the third feature in the third layer includes forming a plurality of openings in the third layer. In some embodiments, patterning the third layer to form the third feature in the third layer includes forming the plurality of third alignment segments such that, in a plan view, a first set of the plurality of first alignment segments is adjacent to a first set of the plurality of third alignment segments, and a second set of the plurality of first alignment segments is adjacent to a second set of the plurality of third alignment segments. The first set of the plurality of third alignment segments is adjacent to the second set of the plurality of third alignment segments along a third direction different from the first direction and the second direction. In some embodiments, patterning the third layer to form the third feature in the third layer includes forming the plurality of fourth alignment segments such that, in a plan view, a first set of the plurality of second alignment segments is adjacent to a first set of the plurality of fourth alignment segments, and a second set of the plurality of second alignment segments is adjacent to a second set of the plurality of fourth alignment segments. The first set of the plurality of fourth alignment segments is adjacent to the second set of the plurality of fourth alignment segments along a fourth direction perpendicular to the third direction.

Another aspect of this description relates to a method of forming a device. The method includes disposing a first feature in a first layer over a substrate. The first feature includes a plurality of first alignment segments extending along a first direction. The method further includes disposing a second feature in a second layer over the first layer. The second feature includes a plurality of second alignment segments extending along a second direction different from the first direction. The method further includes forming a third feature in a third layer over the second layer. The third feature includes a plurality of third alignment segments extending along the first direction and a plurality of fourth alignment segments extending along the second direction. In a plan view, adjacent first alignment segments of the plurality of first alignment segments are separated from each other by a third alignment segment of the plurality of third alignment segments along the second direction, and adjacent second alignment segments of the plurality of second alignment segments are separated from each other by a fourth alignment segment of the plurality of fourth alignment segments along the first direction. In some embodiments, forming the third feature in the third layer includes forming a plurality of openings in the third layer. In some embodiments, forming the third feature in the third layer includes patterning the third layer using photolithography processes. In some embodiments, forming the third feature in the third layer includes forming the plurality of third alignment segments such that, in a plan view, a first set of the plurality of first alignment segments is separated from each other by a first set of the plurality of third alignment segments, and a second set of the plurality of first alignment segments is separated from each other by a second set of the plurality of third alignment segments. The first set of the plurality of third alignment segments and the second set of the plurality of third alignment segments are arranged along a third direction different from the first direction and the second direction. In some embodiments, forming the third feature in the third layer includes forming the plurality of fourth alignment segments such that, in a plan view, a first set of the plurality of second alignment segments is separated from each other by a first set of the plurality of fourth alignment segments, and a second set of the plurality of second alignment segments is separated from each other by a second set of the plurality of fourth alignment segments. The first set of the plurality of fourth alignment segments and the second set of the plurality of fourth alignment segments are arranged along a fourth direction perpendicular from the third direction.

A further aspect of this description relates to a method of adjusting multi-layer overlay alignment. The method includes forming a first feature in a first layer over a substrate. The first feature includes a plurality of first alignment segments extending along a first direction. The method further includes forming a second feature in a second layer over the first layer. The second feature includes a plurality of second alignment segments extending along a second direction different from the first direction. The method further includes forming a third feature in a third layer over the second layer. The third feature includes a plurality of third alignment segments extending along the first direction and a plurality of fourth alignment segments extending along the second direction. In a plan view, adjacent first alignment segments of the plurality of first alignment segments are separated from each other by a third alignment segment of the plurality of third alignment segments along the second direction, and adjacent second alignment segments of the plurality of second alignment segments are separated from each other by a fourth alignment segment of the plurality of fourth alignment segments along the first direction. The method further includes measuring a first deviation between the fourth alignment segments and the second alignment segments in the first direction, calculating a first offset value by the first deviation, measuring a second deviation between the third alignment segments and the first alignment segments in the second direction, calculating a second offset value by the second deviation, and using the first offset value or the second offset value to compensate for an overlay error. In some embodiments, measuring the first deviation between the fourth alignment segments and the second alignment segments includes defining a centerline X1 parallel to the fourth alignment segments, defining a centerline X2 parallel to the second alignment segments, and calculating the first deviation between the centerline X1 and the centerline X2. In some embodiments, measuring the second deviation between the third alignment segments and the first alignment segments includes defining a centerline Y1 parallel to the third alignment segments, defining a centerline Y2 parallel to the first alignment segments, and calculating the second deviation between the centerline Y1 and the centerline Y2. In some embodiments, measuring the first deviation between the fourth alignment segments and the second alignment segments includes detecting an intensity I1 of a positive first order diffraction on gratings of the fourth alignment segments and the second alignment segments, detecting an intensity I2 of a negative first order diffraction on gratings of the fourth alignment segments and the second alignment segments, and calculating an intensity difference of I1 and I2 on gratings of the fourth alignment segments and the second alignment segments, wherein the first deviation is proportional to the intensity difference. In some embodiments, measuring the second deviation between the third alignment segments and the first alignment segments includes detecting an intensity I3 of a positive first order diffraction on gratings of the third alignment segments and the first alignment segments, detecting an intensity I4 of a negative first order diffraction on gratings of the third alignment segments and the first alignment segments, and calculating an intensity difference of I3 and I4 on gratings of the third alignment segments and the first alignment segments, wherein the second deviation is proportional to the intensity difference. In some embodiments, the method further includes removing the third feature if the overlay error is larger than an acceptable deviation.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an overlay mark, comprising:
    disposing a first feature in a first layer, wherein the first feature comprises a plurality of first alignment segments extending along a first direction;
    disposing a second feature in a second layer over the first layer, wherein the second feature comprises a plurality of second alignment segments extending along a second direction different from the first direction; and
    patterning a third layer over the second layer to form a third feature in the third layer, wherein the third feature comprises a plurality of third alignment segments extending along the first direction and a plurality of fourth alignment segments extending along the second direction,
    wherein, in a plan view, each first alignment segment of the plurality of first alignment segments is adjacent to a corresponding third alignment segment of the plurality of third alignment segments along the first direction, and each second alignment segment of the plurality of second alignment segments is adjacent to a corresponding fourth alignment segment of the plurality of fourth alignment segments along the second direction.

2. The method of claim 1, wherein disposing the first feature in the first layer comprises forming the plurality of first alignment segments substantially parallel to each other.

3. The method of claim 1, wherein disposing the first feature in the first layer comprises forming a plurality of isolation structures extending along the first direction.

4. The method of claim 1, wherein disposing the second feature in the second layer comprises forming the plurality of second alignment segments substantially parallel to each other.

5. The method of claim 1, wherein disposing the second feature in the second layer comprises forming a plurality of gate electrodes extending along the second direction.

6. The method of claim 1, wherein the first direction is substantially perpendicular to the second direction.

7. The method of claim 1, wherein patterning the third layer to form the third feature in the third layer comprises forming a plurality of openings in the third layer.

8. The method of claim 1, wherein patterning the third layer to form the third feature in the third layer comprises forming the plurality of third alignment segments such that, in a plan view, a first set of the plurality of first alignment segments is adjacent to a first set of the plurality of third alignment segments, and a second set of the plurality of first alignment segments is adjacent to a second set of the plurality of third alignment segments, wherein the first set of the plurality of third alignment segments is adjacent to the second set of the plurality of third alignment segments along a third direction different from the first direction and the second direction.

9. The method of claim 8, wherein patterning the third layer to form the third feature in the third layer comprises forming the plurality of fourth alignment segments such that, in a plan view, a first set of the plurality of second alignment segments is adjacent to a first set of the plurality of fourth alignment segments, and a second set of the plurality of second alignment segments is adjacent to a second set of the plurality of fourth alignment segments, wherein the first set of the plurality of fourth alignment segments is adjacent to the second set of the plurality of fourth alignment segments along a fourth direction perpendicular to the third direction.

10. A method of forming a device, comprising:
    disposing a first feature in a first layer over a substrate, wherein the first feature comprises a plurality of first alignment segments extending along a first direction;
    disposing a second feature in a second layer over the first layer, wherein the second feature comprises a plurality of second alignment segments extending along a second direction different from the first direction; and
    forming a third feature in a third layer over the second layer, wherein the third feature comprises a plurality of third alignment segments extending along the first direction and a plurality of fourth alignment segments extending along the second direction,
    wherein, in a plan view, adjacent first alignment segments of the plurality of first alignment segments are separated from each other by a third alignment segment of the plurality of third alignment segments along the second direction, and adjacent second alignment segments of the plurality of second alignment segments are separated from each other by a fourth alignment segment of the plurality of fourth alignment segments along the first direction.

11. The method of claim 10, wherein forming the third feature in the third layer comprises forming a plurality of openings in the third layer.

12. The method of claim 10, wherein forming the third feature in the third layer comprises patterning the third layer using photolithography processes.

13. The method of claim 10, wherein forming the third feature in the third layer comprises forming the plurality of third alignment segments such that, in a plan view, a first set of the plurality of first alignment segments is separated from each other by a first set of the plurality of third alignment segments, and a second set of the plurality of first alignment segments is separated from each other by a second set of the plurality of third alignment segments, wherein the first set of the plurality of third alignment segments and the second set of the plurality of third alignment segments are arranged along a third direction different from the first direction and the second direction.

14. The method of claim 13, wherein forming the third feature in the third layer comprises forming the plurality of fourth alignment segments such that, in a plan view, a first set of the plurality of second alignment segments is separated from each other by a first set of the plurality of fourth alignment segments, and a second set of the plurality of second alignment segments is separated from each other by a second set of the plurality of fourth alignment segments, wherein the first set of the plurality of fourth alignment segments and the second set of the plurality of fourth alignment segments are arranged along a fourth direction perpendicular from the third direction.

15. A method of adjusting multi-layer overlay alignment, comprising:
  forming a first feature in a first layer over a substrate, wherein the first feature comprises a plurality of first alignment segments extending along a first direction;
  forming a second feature in a second layer over the first layer, wherein the second feature comprises a plurality of second alignment segments extending along a second direction different from the first direction;
  forming a third feature in a third layer over the second layer, wherein the third feature comprises a plurality of third alignment segments extending along the first direction and a plurality of fourth alignment segments extending along the second direction, wherein, in a plan view, adjacent first alignment segments of the plurality of first alignment segments are separated from each other by a third alignment segment of the plurality of third alignment segments along the second direction, and adjacent second alignment segments of the plurality of second alignment segments are separated from each other by a fourth alignment segment of the plurality of fourth alignment segments along the first direction;
  measuring a first deviation between the fourth alignment segments and the second alignment segments in the first direction;
  calculating a first offset value by the first deviation;
  measuring a second deviation between the third alignment segments and the first alignment segments in the second direction;
  calculating a second offset value by the second deviation; and
  using the first offset value or the second offset value to compensate for an overlay error.

16. The method of claim 15, wherein measuring the first deviation between the fourth alignment segments and the second alignment segments comprises:
  defining a centerline X1 parallel to the fourth alignment segments;
  defining a centerline X2 parallel to the second alignment segments; and
  calculating the first deviation between the centerline X1 and the centerline X2.

17. The method of claim 15, wherein measuring the second deviation between the third alignment segments and the first alignment segments comprises:
  defining a centerline Y1 parallel to the third alignment segments;
  defining a centerline Y2 parallel to the first alignment segments; and
  calculating the second deviation between the centerline Y1 and the centerline Y2.

18. The method of claim 15, wherein measuring the first deviation between the fourth alignment segments and the second alignment segments comprises:
  detecting an intensity I1 of a positive first order diffraction on gratings of the fourth alignment segments and the second alignment segments;
  detecting an intensity I2 of a negative first order diffraction on gratings of the fourth alignment segments and the second alignment segments; and
  calculating an intensity difference of I1 and I2 on gratings of the fourth alignment segments and the second alignment segments, wherein the first deviation is proportional to the intensity difference.

19. The method of claim 15, wherein measuring the second deviation between the third alignment segments and the first alignment segments comprises:
  detecting an intensity I3 of a positive first order diffraction on gratings of the third alignment segments and the first alignment segments;
  detecting an intensity I4 of a negative first order diffraction on gratings of the third alignment segments and the first alignment segments; and
  calculating an intensity difference of I3 and I4 on gratings of the third alignment segments and the first alignment segments, wherein the second deviation is proportional to the intensity difference.

20. The method of claim 15, further comprising removing the third feature if the overlay error is larger than an acceptable deviation.

* * * * *